United States Patent
Shigetomi et al.

(10) Patent No.: US 10,886,151 B2
(45) Date of Patent: Jan. 5, 2021

(54) HEATING APPARATUS AND SUBSTRATE PROCESSING APPARATUS

(71) Applicant: Tokyo Electron Limited, Tokyo (JP)

(72) Inventors: Kenichi Shigetomi, Koshi (JP); Takeshi Saikusa, Koshi (JP); Takayuki Fukudome, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 332 days.

(21) Appl. No.: 15/882,111

(22) Filed: Jan. 29, 2018

(65) Prior Publication Data

US 2018/0218925 A1 Aug. 2, 2018

(30) Foreign Application Priority Data

Jan. 30, 2017 (JP) .................................. 2017-014298

(51) Int. Cl.
*H01L 21/67* (2006.01)
*H01L 21/66* (2006.01)

(52) U.S. Cl.
CPC .. *H01L 21/67098* (2013.01); *H01L 21/67103* (2013.01); *H01L 21/67144* (2013.01); *H01L 21/67248* (2013.01); *H01L 22/12* (2013.01); *H01L 22/26* (2013.01)

(58) Field of Classification Search
CPC ... H01L 22/12; H01L 22/26; H01L 21/67248; G05B 19/404

USPC ....................................................... 219/444.1
See application file for complete search history.

(56) References Cited

U.S. PATENT DOCUMENTS 8,367,975 B2 * 2/2013 Sugishita .............. H01L 21/324
219/385
2018/0053668 A1 * 2/2018 Mimura ............ H01L 21/67248

FOREIGN PATENT DOCUMENTS

| JP | 2003-051439 A | 2/2003 |
| JP | 2006-080489 A | 3/2006 |
| JP | 2006-173185 A | 6/2006 |
| JP | 2008-141071 A | 6/2008 |
| JP | 4391518 B | 10/2009 |

* cited by examiner

*Primary Examiner* — Janie M Loeppke
(74) *Attorney, Agent, or Firm* — Pearne & Gordon LLP

(57) ABSTRACT

Time periods required for a wafer W to reach a reference temperature are made to be uniform between heating modules 2 and between heating target regions in a temperature rising time period after the wafer W is placed on a heating plate 23, and temperature rise curves of temperature transition profiles in a temperature rise transition time period are made to be same. Therefore, the temperature transition profiles of the heating target regions are all same, and total heat amounts in the temperature rise transition time period are uniform within a surface of the wafer W and between the heating modules 2, so that a line width of a pattern formed on the wafer W becomes uniform. Thus, it is possible to perform a heating treatment with high uniformity within the surface of the wafer W and between the wafers W processed in the different heating modules 2.

4 Claims, 18 Drawing Sheets

| | 1ch | 2ch | 3ch | - - - - - - - - - - - | 11ch |
|---|---|---|---|---|---|
| SECOND ADJUSTMENT OFFSET VALUE | | | | | |
| $\Delta t_1$ | $\alpha 11$ | $\alpha 12$ | $\alpha 13$ | - - - - - - - - - - - | $\alpha 111$ |
| $\Delta t_2$ | $\alpha 21$ | $\alpha 22$ | $\alpha 23$ | - - - - - - - - - - - | $\alpha 211$ |
| $\Delta t_3$ | $\alpha 31$ | $\alpha 32$ | $\alpha 33$ | - - - - - - - - - - - | $\alpha 311$ |
| ⋮ | ⋮ | ⋮ | ⋮ | ⋮ | ⋮ |
| $\Delta t_n$ | $\alpha n1$ | $\alpha n2$ | $\alpha n3$ | - - - - - - - - - - - | $\alpha n11$ |

63  6

| PROCESSING OFFSET VALUES | | | | | |
|---|---|---|---|---|---|
| | 1ch | 2ch | 3ch | - - - - - - - - - - - - - | 11ch |
| Δt₁ | β11 | β12 | β13 | - - - - - - - - - - - - | β111 |
| Δt₂ | β21 | β22 | β23 | - - - - - - - - - - - - | β211 |
| Δt₃ | β31 | β32 | β33 | - - - - - - - - - - - - | β311 |
| ⋮ | ⋮ | ⋮ | ⋮ | ⋮ | ⋮ |
| Δtₙ | βn1 | βn2 | βn3 | - - - - - - - - - - - - - | βn11 |

63  6

2-1

HEATING APPARATUS AND SUBSTRATE PROCESSING APPARATUS

CROSS-REFERENCE TO RELATED APPLICATION

This application claims the benefit of Japanese Patent Application No. 2017-014298 filed on Jan. 30, 2017, the entire disclosures of which are incorporated herein by reference.

TECHNICAL FIELD

The embodiments described herein pertain generally to a technique of mounting a substrate on a mounting table and heating the substrate.

BACKGROUND

In a semiconductor manufacturing process, after a coating film is formed on a substrate such as a semiconductor wafer (hereinafter, referred to as "wafer"), the substrate is mounted on a mounting table in which a heater is provided, and a heating treatment is performed on the substrate. As an example of this heating treatment, a resist film formed on the substrate is heated at a temperature of, e.g., 100° C. or thereabout before and after an exposure process. A line width of a resist pattern relies on various factors, and one of these factors is a heating temperature in the heating treatment.

In view of the fact that dependency of a chemical liquid upon the heating temperature tends to increase, a difference in thermal history of the wafer in the heating treatment within a surface of the wafer (in-plane) and between wafers (inter-plane) has an increasing influence upon uniformity in the line width of the resist pattern within the surface of the wafer and between the wafers.

As for a heating module configured to perform the heating treatment, a heating target region of the wafer is divided into multiple division regions, and a heater is provided for each of these division regions. Heating of each heater is controlled individually. As a parameter adjusting method of a control system of the heater, there is known a method of, as described in Patent Document 1, performing a control in which temperature of the mounting table (heating plate) is measured at multiple measurement points and each of the measurement temperatures coincides with a corresponding target temperature.

The temperature of the wafer is raised to the target temperature in a state that the wafer is mounted on the heating plate having a stable heating temperature. Even if, however, the target temperature on the heating target regions (division regions) of the wafer is set to be same, temperature transition profiles of the respective heating target regions until the temperature of each heating target region reaches the target temperature may be deviated from each other and may not coincide with each other. As a result, in each heating target region, total heat amounts until the temperature is raised to reach the target temperature may be differed, so that the line width of the pattern may become non-uniform within the surface of the wafer or between the heating modules.

Patent Document 1: Japanese Patent No. 4,391,518

SUMMARY

In view of the foregoing, exemplary embodiments provide a technique of performing a heating treatment with high uniformity within a surface of a substrate or between substrates.

In one exemplary embodiment, there is provided a heating apparatus configured to mount a substrate on a mounting table and heat the substrate. The heating apparatus includes multiple heaters which are provided in the mounting table and heat generation amounts of which are controlled independently; temperature detection units each configured to detect a temperature of heating target region heated by the corresponding heater; and temperature control units respectively provided for the heaters. Each of the temperature control units includes an adjusting unit configured to calculate a deviation between the detected temperature of the corresponding temperature detection unit and a set temperature and output a control signal for a supply power to the corresponding heater; an adding unit configured to obtain the set temperature by adding a target temperature as a processing temperature and a correction value; and a correction value output unit configured to output the correction value. The correction value output unit is configured to output time series data defining the correction value at every elapsed time such that a temperature of the substrate at a predetermined reference time point while the temperature of the substrate rises toward the processing temperature becomes a reference temperature on a temperature transition profile of the substrate which indicates a relationship between the temperature of the substrate and the elapsed time after the substrate is mounted on the mounting table in a state that the heat generation amount of the heater is stabilized.

The heating apparatus may further include a storage unit configured to store therein, for each of the heating target regions of the substrate respectively corresponding to the multiple heaters, an offset value for each of time intervals, which are obtained by dividing a time period from a first preset time point to a second preset time point in plural. The adding unit is configured to add the target temperature, the correction value and the offset value. The first preset time point is a time point while the temperature of the substrate rises toward the processing temperature on the temperature transition profile of the substrate after the substrate is mounted on the mounting table in the state that the heat generation amount of the heater is stabilized, and the second preset time point is a time point after the temperature of the substrate reaches the processing temperature on the temperature transition profile. The offset value is set such that total heat amounts of the heating target regions of the substrate respectively corresponding to the multiple heaters in the time period from the first preset time point to the second preset time point are identical between the heating target regions.

In another exemplary embodiment, there is provided a substrate processing apparatus including the multiple heating apparatuses described above. The offset value is set such that the total heat amounts of the heating target regions of the substrate respectively corresponding to the multiple heaters in the time period from the first preset time point to the second preset time point are identical between the multiple heating apparatuses.

According to the exemplary embodiments, in each of the multiple heating modules, the total heat amounts of the heating target regions of the substrate respectively corresponding to the multiple heaters while performing the heating treatment of the substrate are set to be uniform within a single heating module and between the multiple heating modules. Therefore, the heating treatment can be performed with high uniformity within the surface of the single substrate or between the multiple substrates.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
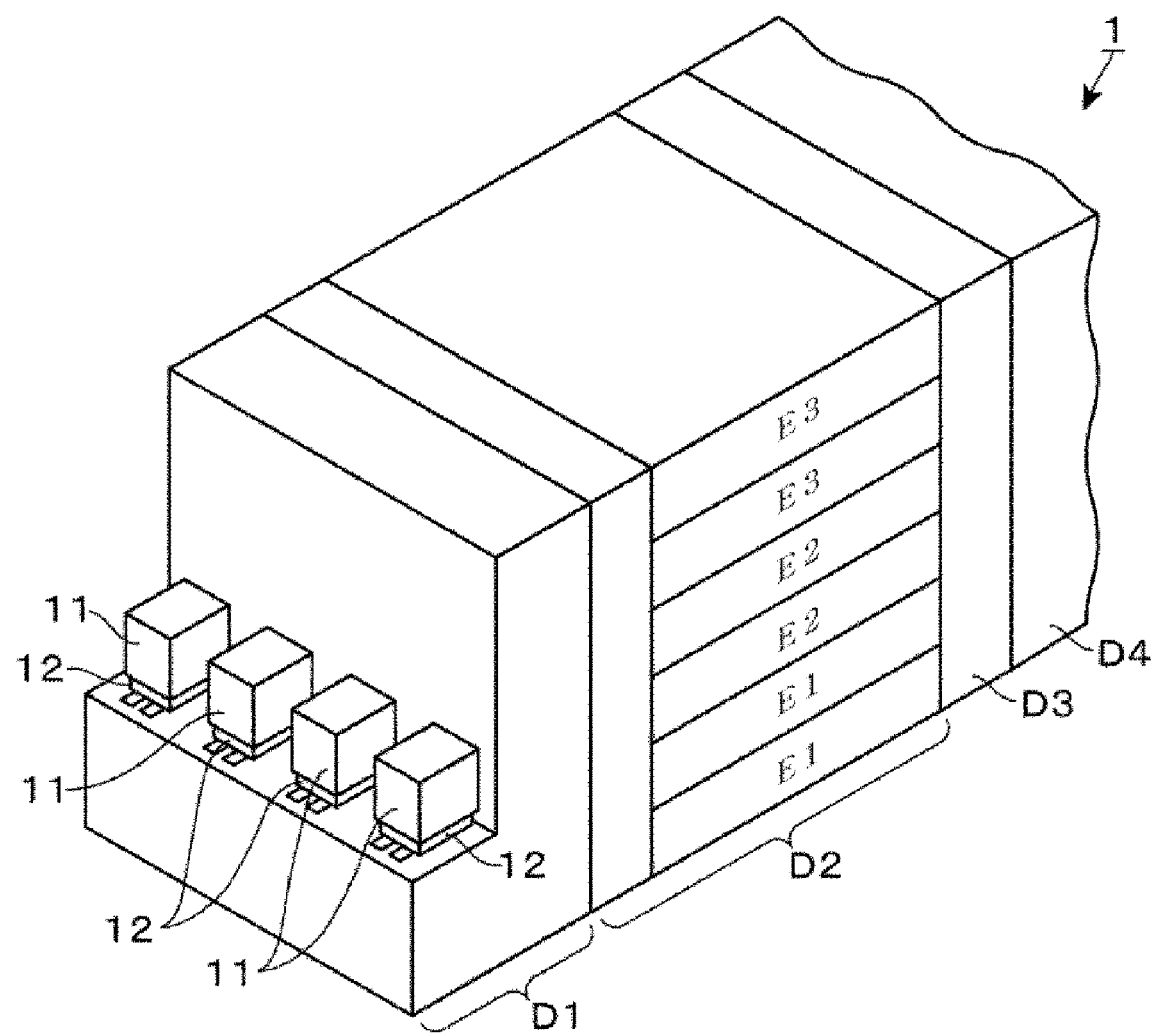
FIG. 1 is a perspective view of a coating and developing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein First Exemplary Embodiment An example where a substrate processing apparatus according to a first exemplary embodiment is applied to a coating and developing apparatus 1 will be explained. As depicted in FIG. 1, the coating and developing apparatus 1 includes a carrier block D1, a processing block D2 and an interface block D3 which are horizontally connected in this sequence in a straight line shape. An arrangement direction of the blocks D1 to D3 is defined as a forward-backward direction. Further, an exposure apparatus D4 is connected to the interface block D3 at an opposite side to the processing block D2.

The carrier block D1 is equipped with mounting tables 12 each of which is configured to mount thereon a carrier 11 which accommodates therein a multiple number of wafers W as circular substrates. The processing block D2 includes two unit blocks E1, two unit blocks E2 and two unit blocks E3. These unit blocks E1 to E3 are stacked on top of each other. As for the two same unit blocks E, a wafer W is transferred into and processed by either one of them.

The unit block E1 is configured to form an antireflection film by coating on the wafer W a chemical liquid for forming the antireflection film and by performing a heating treatment of the wafer W after the coating of the chemical liquid. The unit block E2 is configured to form a resist film by coating a resist on the wafer W and by performing a heating treatment of the wafer W after the coating of the resist. The unit block E3 is configured to form a resist pattern on the wafer W by performing a heating treatment of the wafer W after the resist film is exposed to light in the exposure apparatus D4 according to a preset pattern and by supplying a developing liquid onto the wafer W after the heating treatment thereof. The heating treatment in the unit block E3 is performed to remove a standing wave after the exposure, which is called "post exposure bake" (PEB), or to perform a chemical reaction on an exposed portion of the resist film in case that the resist is of a chemical amplification type.

Each of the blocks D1 to D3 is equipped with a transfer mechanism for the wafer W. The wafer W within the carrier 11 is transferred in the order of the carrier block D1→the unit block E1→the unit block E2→the interface block D3→the exposure apparatus D4→the interface block D3→the unit block E3, and subjected to the aforementioned individual processings, so that the resist pattern is formed on the wafer W. Then, the wafer W is transferred back to the carrier block D1 and accommodated into the carrier 11.

Figure 2:
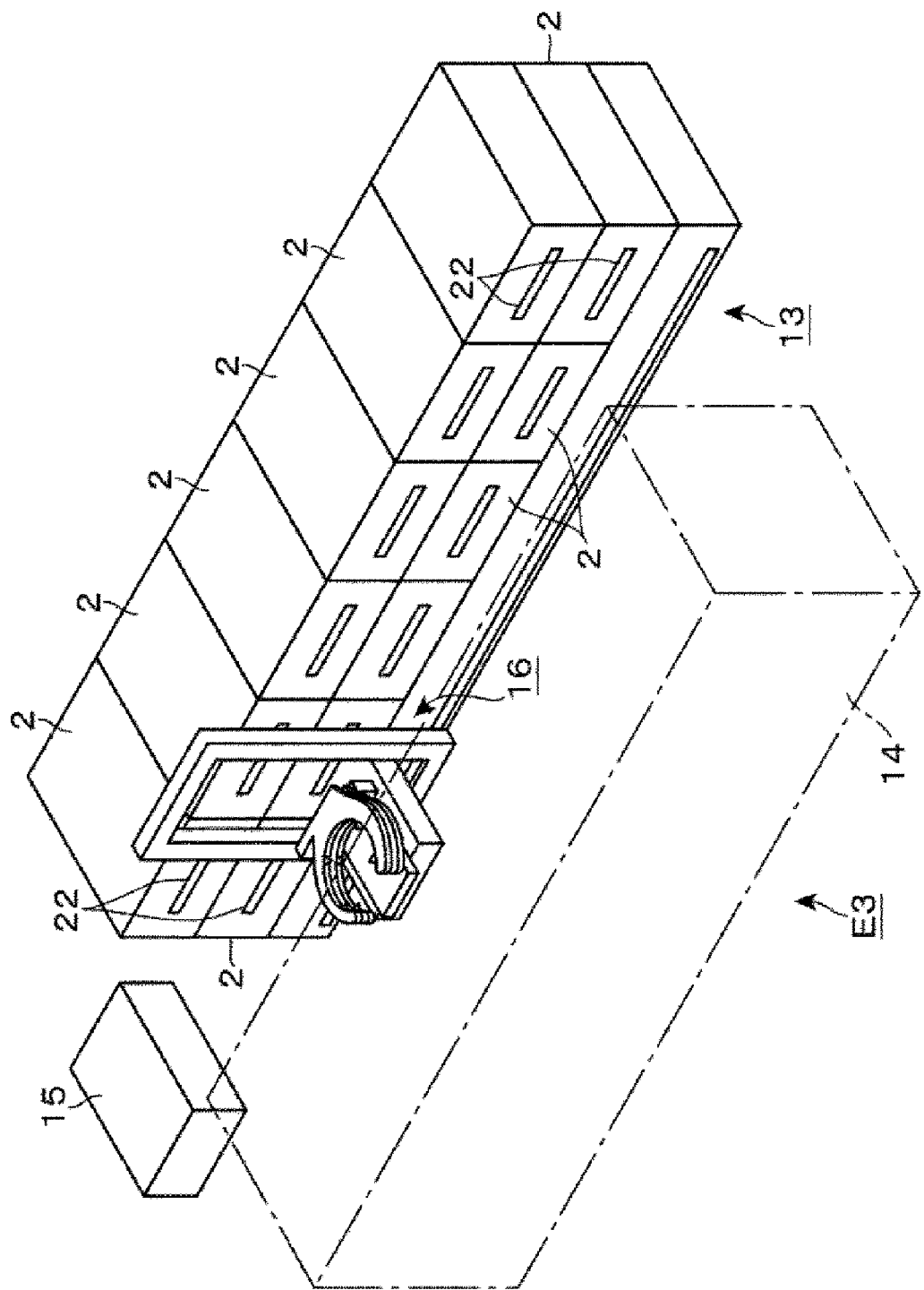
FIG. 2 is a perspective view of a processing block of the coating and developing apparatus.

FIG. 2 is a perspective view illustrating the unit block E3. A transfer path 13 for the wafer W extended in the forward-backward direction is provided at a central portion of the unit block E3. Multiple heating modules 2 each configured to perform the aforementioned PEB are provided at one side of the left and right sides of the transfer path 13. The heating modules 2 are arranged in a matrix shape along the forward-backward direction and the vertical direction. Each of these heating modules 2 corresponds to a heating apparatus. Provided at the other side of the left and right sides of the transfer path 13 is a developing module 14 configured to supply the developing liquid onto the wafer W having been subjected to the PEB as stated above. In the drawing, a reference numeral 15 denotes a delivery module in which the wafer W is placed to be delivered to the carrier block D1.

Further, a reference numeral 16 in the drawing denotes a transfer mechanism for the wafers W, and this transfer mechanism 16 is configured to transfer the wafer W between the delivery module 15, the developing module 14, the heating modules 2 and the interface block D3. The wafer W carried into the unit block E3 from the interface block D3 by the transfer mechanism 16 is transferred into and processed in one of the multiple heating modules 2. Each heating module 2 is configured, as parameters are set as will be described later, such that the resist pattern formed within a surface of the single wafer W has high uniformity and, also, the resist pattern formed between the wafers W has high uniformity.

Figure 3:
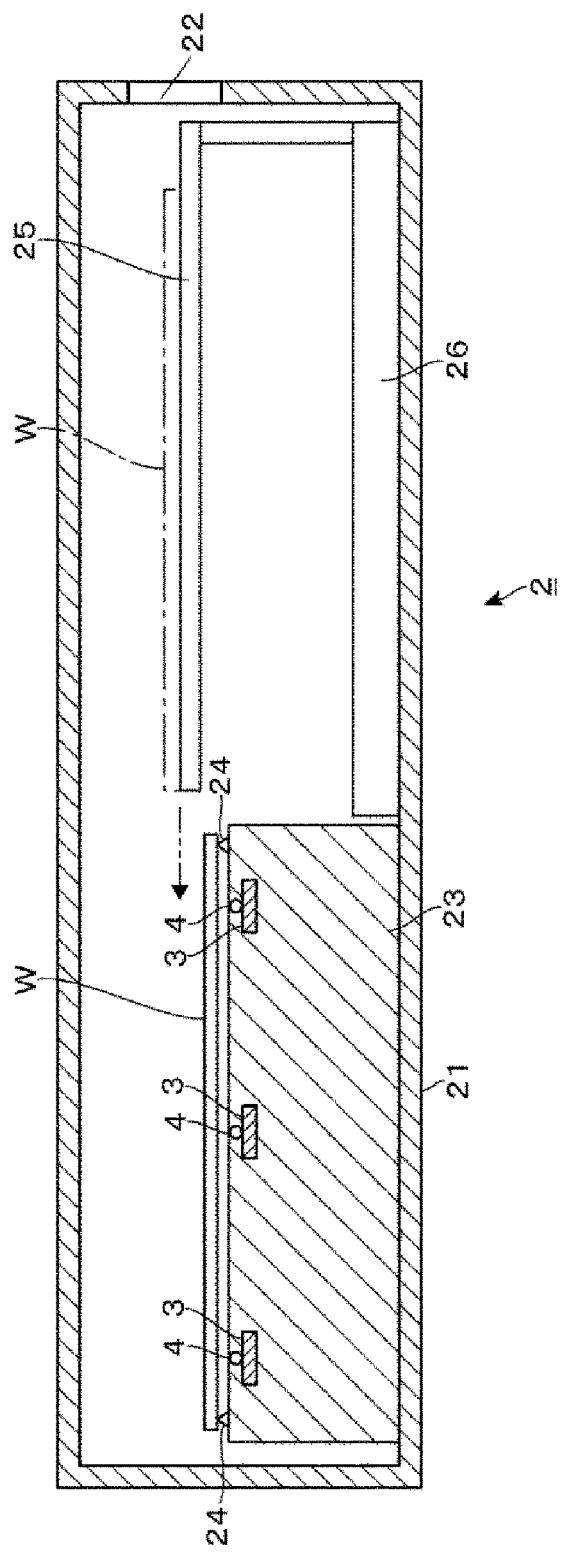
FIG. 3 is a longitudinal side sectional view of a heating module provided in the processing block.

FIG. 3 is a longitudinal cross sectional view of the heating module 2. The heating module 2 has a housing 21, and a transfer port 22 for the wafer W is provided at a sidewall of the housing 21 on the side of the transfer path 13. In the drawing, a reference numeral 23 denotes a horizontal heating plate a surface of which is heated, and a reference numeral 24 denotes a plurality of supporting pins provided on the surface of the heating plate 23. The wafer W is placed on the supporting pins 24 and is heated while being slightly spaced apart from the surface of the heating plate 23. Further, a reference numeral 25 denotes a cooling plate configured to mount thereon the wafer W to adjust a temperature of the wafer W and cool the wafer W before or after the heating treatment of the wafer W. The cooling plate 25 is horizontally moved between a position above the heating plate 23 and a standby position outside the heating plate 23 as shown in FIG. 3, and relays the wafer W between the transfer mechanism 16 of the unit block E3 and the heating plate 23. The transfer mechanism 16 is moved up and down with respect to the cooling plate 25 placed at the standby position, and the wafer W is delivered between the transfer mechanism 16 and the cooling plate 25. Further, the wafer W is delivered between the heating plate 23 and the cooling plate 25 by the combination of an elevating movement of non-illustrated elevating pins provided at the heating plate 23 and a movement of the cooling plate 25.

Figure 4:
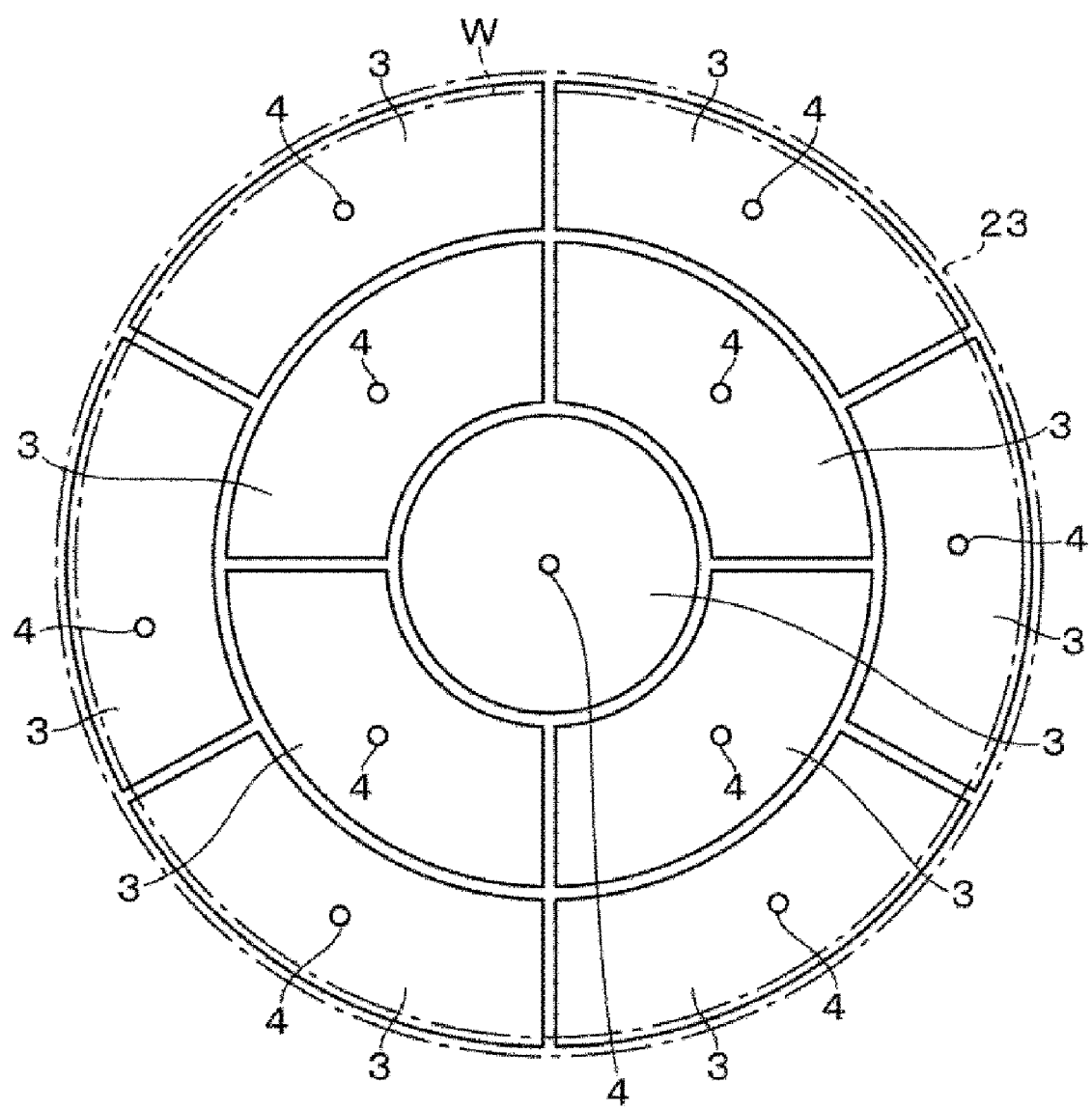
FIG. 4 is a plan view of a heating plate provided in the heating module.

The heating plate 23 configured as a mounting table for the wafer W will be described in further detail with reference to a plan view of FIG. 4. Heaters 3 are buried in different regions of the heating plate 23, when viewed from the top. As an example, FIG. 4 illustrates a configuration in which eleven heaters 3 are respectively provided in eleven regions. These heaters 3 are respectively provided for first to eleventh channels 1ch to 11ch and may sometimes be distinguished by being assigned the channel numbers. As heat generation amounts of the individual heaters 3 of 1ch to 11ch are independently controlled, temperatures of the regions of the heating plate 23 where the respective heaters 3 are provided are also independently controlled. That is to say, the surface of the heating plate 23 is divided in eleven division regions, and the heater 3 is provided in each of the division regions such that the temperature of each division region is controlled individually. With this configuration of the heating plate 23, the temperature of the wafer W placed on the heating plate 23 is controlled such that a temperature of a region of the wafer W corresponding to each division region of the heating plate 23 reaches the temperature of the corresponding heater 3. That is, eleven heating target regions of the wafer W respectively corresponding to the heaters 3 of 1ch to 11ch are individually heated by the corresponding heaters 3.

The heating plate 23 is equipped with heater temperature sensors 4 respectively provided in the division regions. Each heater temperature sensor 4 is a temperature detection unit configured to detect the temperature of the corresponding heater 3 and output a detection signal. Further, the heating module 2 is also equipped with temperature control units 5 respectively provided for the corresponding heaters 3. Each temperature control unit 5 is configured to control the temperature of the corresponding heating target region heated through the corresponding heater 3 by adjusting the heat generation amount of the heater 3. That is, the eleven temperature control units 5 corresponding to the eleven channels are provided for the single heating plate 23. In the following description, the temperature control units 5, individual constituent components belonging to the temperature control units 5 and the division regions of the heating plate 23 may sometimes be assigned the channel numbers, like the heaters 3.

Figure 5:
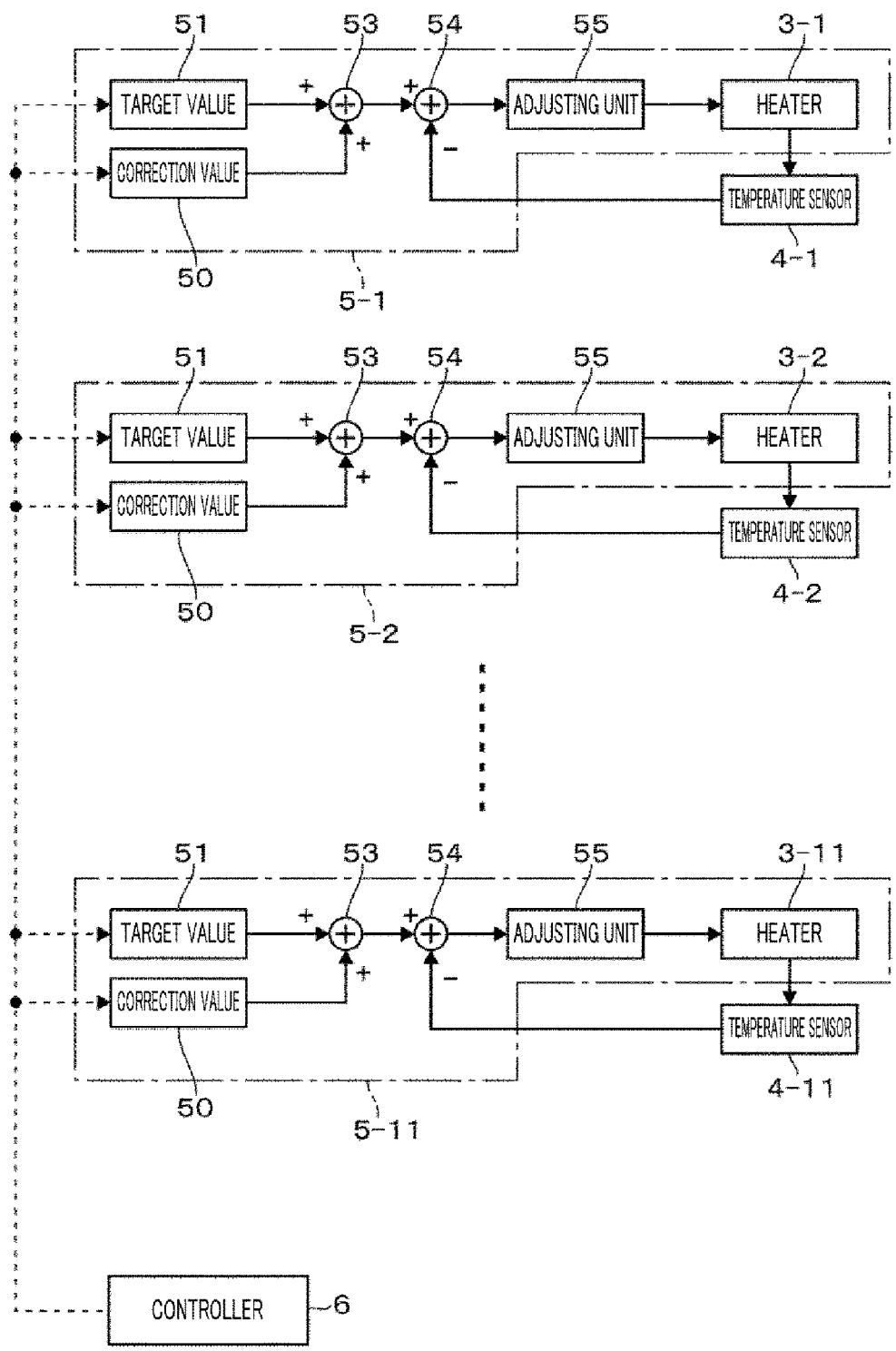
FIG. 5 a block diagram of a control system constituting a temperature adjusting device provided in the heating module.

FIG. 5 is a block diagram illustrating a control system including the temperature control units 5. For the heaters 3, the heater temperature sensors 4 and the temperature control units 5, the channel numbers are added after hyphens assigned after the reference numerals 3 to 5 which denote these components. For example, the temperature control unit 5 of 1ch is assigned a reference numeral 5-1, and the temperature control unit 5 of 11ch is assigned a reference numeral 5-11. However, for the sake of simplicity, these channel numbers may be omitted for adding units or adjusting units constituting the temperature control units 5 to be described later. The temperature control units 5 of 1ch to 11ch are connected to a controller 6 which is implemented by a computer, and a signal indicating a target value of the wafer W and a signal indicating an offset value with respect to the target value are sent to each temperature control unit 5 from the controller 6.

The temperature control units 5 of 1ch to 11ch have the same configuration. Here, the temperature control unit 5 of 1ch will be explained on behalf of the others. The temperature control unit 5 is equipped with a target value output unit 51, a correction value output unit 50, a first adding unit 53, a second adding unit 54 and an adjusting unit 55. The target value output unit 51 includes a serial/parallel converter configured to convert a serial signal, which corresponds to the target value of the temperature of the wafer W sent from the controller 6 to a parallel signal, for example; a register configured to maintain the parallel signal; a digital/analog converter configured to convert the digital signal maintained in the register to an analog signal; and so forth. The correction value output unit 50 includes a serial/parallel converter configured to convert a serial signal, which corresponds to a correction value to be described later for correcting the target value of the temperature of the wafer W sent from the controller 6 to a parallel signal, for example; a register configured to maintain the parallel signal; a digital/analog converter configured to convert the digital signal maintained in the register to an analog signal; and so forth.

The first adding unit 53 is configured to add the target value of the temperature of the wafer W output from the target value output unit 51 and the correction value output from the correction value output unit 50, and is configured to output the added value corresponding to a set temperature of the heater 3 to a subsequent stage. The second adding unit 54 is configured to calculate a deviation value between the output value of the first adding unit 53 and an output value of the heater temperature sensor 4, and is configured to output this deviation value to the adjusting unit 55. The adjusting unit 55 is configured to perform an operation on this deviation value based on a preset transfer function and output an instruction value of a power supplied to the heater 3. By way of example, the adjusting unit 55 may perform a PID operation on the deviation value.

Figure 6:
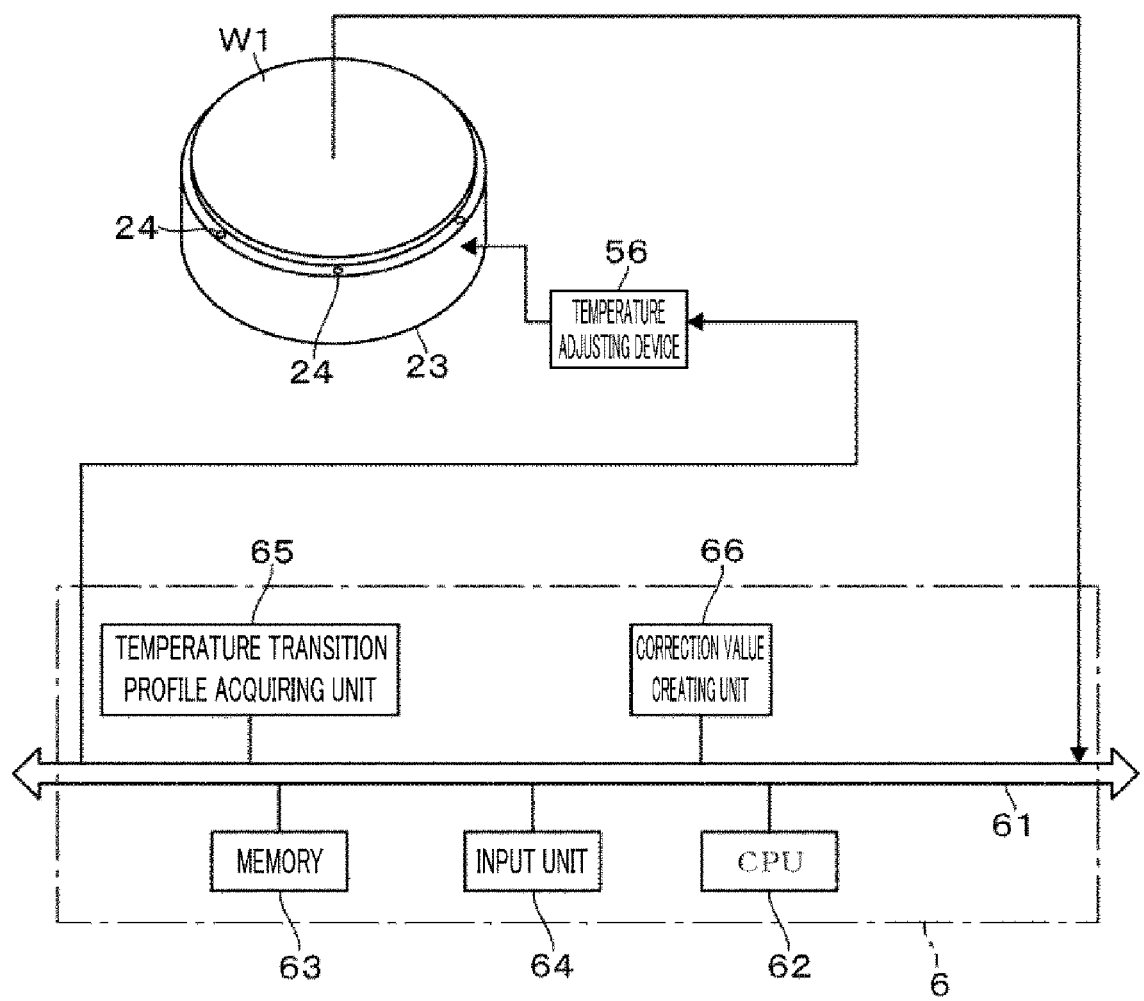
FIG. 6 is a block diagram of a controller provided in the heating module.

The target value of the temperature of the wafer W sent from the controller 6 to the temperature control unit 5 is common between the channels, for example. Meanwhile, the correction value sent from the controller 6 to the temperature control unit 5 is set individually for each channel. The temperature control unit 5 of each channel constitutes a temperature adjusting device 56 shown in FIG. 6. Further, the controller 6 and the temperature adjusting device 56 constitute a control unit. FIG. 6 illustrates a state in which a wafer W1 for adjustment (hereinafter, referred to as "adjustment wafer W1") to be used for setting the aforementioned correction value as will be descried later is placed on the heating plate 23. The controller 6 is equipped with a CPU 62, a memory (storage unit) 63, an input unit 64, a temperature transition profile acquiring unit 65 and a correction value creating unit 66 which are respectively connected to a bus 61. The temperature transition profile acquiring unit 65 is configured to receive a temperature detection signal (temperature of the wafer W) input from the temperature detection unit provided in each of the heating target regions of the adjustment wafer W1 respectively corresponding to the heaters 3. Further, the temperature transition profile acquiring unit 65 is configured to create a temperature transition profile which is a characteristic graph showing a variation of a temperature of each of the heating target regions of the wafer W with a lapse of time after a timing when the wafer W is placed on the supporting pins 24. Further, the correction value creating unit 66 is a program for setting the correction value to be described later based on the temperature transition profile of each heating target region. Furthermore, the temperature of the wafer W may be detected by temperature detection units provided in the heaters 3.

Figure 7:
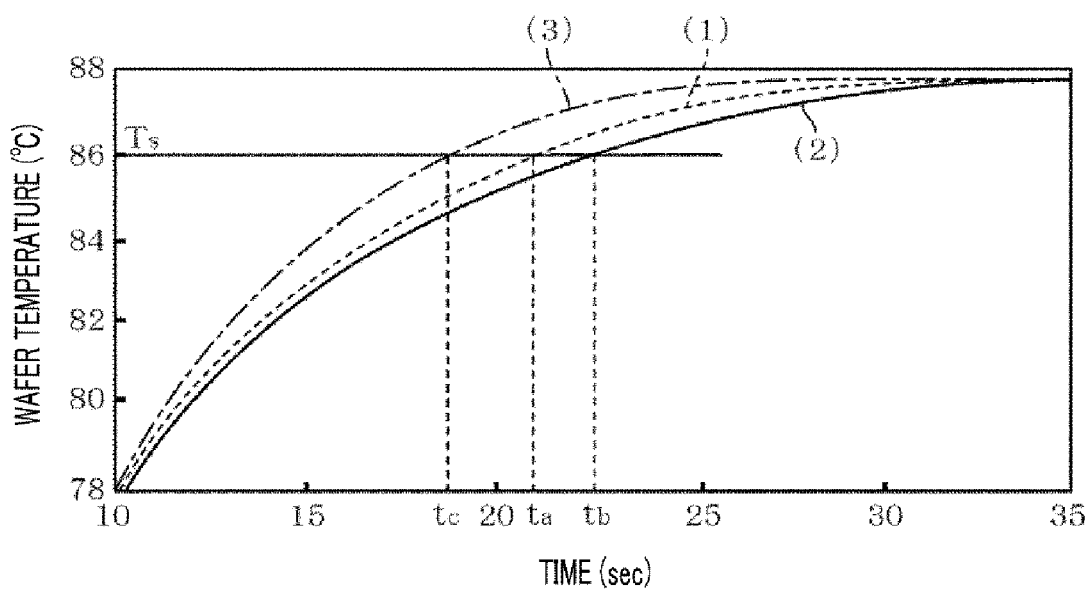
FIG. 7 is a characteristic graph showing temperature transition profiles obtained by a temperature sensor.

Now, the correction value will be explained. Even if the heaters 3 provided in the heating plate 23 are designed, by setting the temperature control units 5 to have the same configuration, such that the temperature transition profiles showing the variation of the temperatures of the wafer W with the lapse of time are identical, temperature rise curves of the heating target regions of the wafer W corresponding to the heaters 3 after the wafer W is placed on the heating plate 23 are found not to be identical at all. FIG. 7 shows the temperature transition profiles of the heating target regions of the wafer W placed on the heating plate 23 corresponding to the heaters 3: (1) represents a reference temperature transition profile, and (2) and (3) are temperature transition profiles before the adjustment is made (that is, when the correction value is set to be zero). Here, a temperature rising portion on each temperature transition profile will be referred to as a "temperature rise curve." A temperature rise curve of (2) is located under a reference temperature rise curve, and a temperature rise curve of (3) is located above the reference temperature rise curve. Further, the degrees of deviation of the temperature rise curves of (2) and (3) with respect to the reference temperature rise curve is rather exaggerated than they really are.

Figure 8:
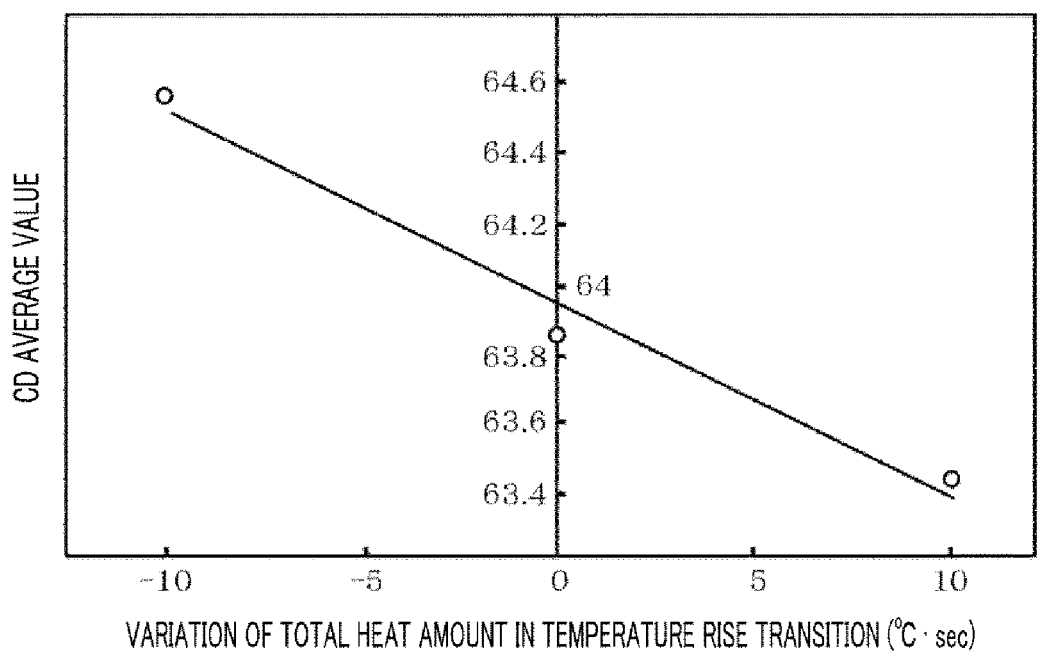
FIG. 8 is a characteristic graph showing a relationship between a CD and a total heat amount in a temperature rising period.

If the temperature rise curves at different portions on the wafer W are different from each other, total heat amounts applied to those different portions of the wafer W are not uniform when the temperature thereof is raised, so that a line width (CD: Critical Dimension) of a pattern formed on the wafer W after a developing process becomes non-uniform within the surface of the wafer W. FIG. 8 is a graph showing a relationship between a variation amount of the total heat amount (total heat amount in temperature rise transition) applied to the heating target region of the wafer W on the entire temperature rise curve and a size of the CD of the corresponding heating target region. Here, the total heat amount in the reference temperature rise curve (the target temperature transition profile) is regarded as zero.

Figure 9:
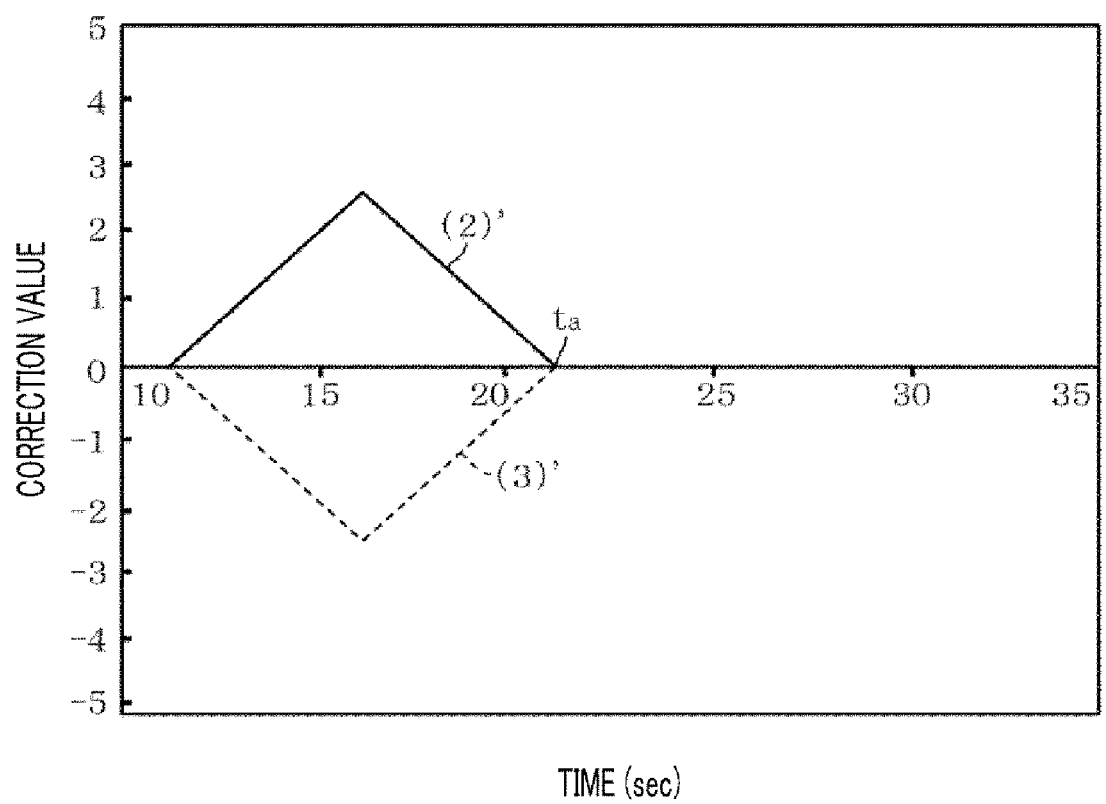
FIG. 9 is a characteristic graph showing examples of correction values.

As can be seen from FIG. 8, there is a correlation between the total heat amount and the CD. Accordingly, the correction value is set such that the temperature rise curve of the heating target region of the wafer W corresponding to each heater 3 coincides with (becomes very close to) the reference temperature rise curve. Assuming that a temperature on the reference temperature rise curve is $T_s$ at a time point $t_a$ when a certain period of time has elapsed after the wafer W is placed on the heating plate 23, a time period required for the temperature to reach the value $T_s$ needs to be shortened from $t_b$ to $t_a$ to allow the temperature rise curve of (2) to coincide with the reference temperature rise curve. Accordingly, in the temperature control unit 5, to increase the target value (target temperature) at a time point before the time point $t_a$, the correction value which needs to be added to the target value, particularly, time series data of the correction value is previously obtained, and this correction value is added to the target value. FIG. 9 shows the time series data of the correction values. Here, (2)' is correction value data set to allow the temperature rise curve of (2) to become close to the reference temperature rise curve. Further, a zero point on a horizontal axis is a time point when the wafer W is placed on the heating plate 23 whose temperature is stabilized (that is, the time point when the wafer W is placed on the supporting pins 24).

Further, though FIG. 9 shows the correction values when the target value is constant after the wafer W is placed on the heating plate 23, the present disclosure may also be applied to a case where the target value is not constant as will be described in another exemplary embodiment.

Further, to allow the temperature rise curve of (3) to coincide with the reference temperature rise curve, a time period required for the temperature to reach the value $T_s$ needs to be delayed from $t_c$ to $t_a$. Accordingly, in the temperature control unit 5, to decrease the target value (target temperature) at a time point before the time point $t_a$, a correction value shown on the graph (3)' is added to the target value. In this way, the correction values as shown in the example of FIG. 9 are previously obtained for the respective temperature control units 5 corresponding to the individual heaters 3, and stored in a memory 63 of the controller 6, for example. Then, from the time point when the wafer W is placed on the heating plate 23, the time series data as the correction value (including a value of zero) are read out to be sent to the correction value output units 50 of the temperature control units 5. Further, the characteristic graphs of the correction values shown in FIG. 9 are illustrated as schematic patterns and do not designate accurate values.

If the temperature control unit 5 is only focused on, the component assigned the reference numeral 50 is the correction value output unit. When viewed from the entire apparatus, however, the memory 63 and a component configured to read out the correction value in the memory 63 may also be regarded as the correction value output unit.

Now, a method of setting the correction values corresponding to the respective heaters 3 of 1ch to 11ch in each heating module 2 will be explained. As explained in FIG. 6, the user places the adjustment wafer W1 on the heating plate 23, and acquires, for the heaters 3 of 1ch to 11ch, the temperature transition profiles of 1ch to 11ch based on the temperature detection signals output from the respective temperature sensors of the adjustment wafer W1. The heater 3 of 1ch will be explained, for example. The user acquires a time point $t_b$ at which the temperature reaches a reference temperature, e.g., 86° C. from the acquired temperature transition profile. If the target temperature is denoted by T1 (° C.) and a temperature of the wafer W immediately before the wafer W is placed on the heating plate 23 is denoted by T2 (° C.), the reference temperature is a temperature selected within a range of $\{T2+(T1-T2)\times 0.6\} \sim \{T2+(T1-T2)\times 0.99\}$.

Then, there is calculated a time difference $\Delta T(\Delta T=t_a-t_b)$ between the time $t_a$ needed to reach the reference temperature on the target temperature transition profile and the time $t_b$ needed to reach the reference temperature on the temperature transition profile of 1ch from the time point at which the wafer W is placed on the heating plate 23.

For example, regarding the correction values, a simulation in which the temperature transition profiles change according to the correction values is previously created, and, the correction value for allowing the time needed to reach the reference temperature to coincide with that of the target temperature transition profile are previously calculated depending on the $\Delta T$, and stored in the memory 63 as, for example, a data table. Then, the correction values are read out from the memory 63 such that, according to the above-stated time differences $\Delta T$, in the respective heaters 3 of 1ch to 11ch, the times needed for the heating target regions to reach the reference temperature are adjusted as described above, thus allowing the temperature transition profiles thereof to be coincident with the target temperature transition profile.

Further, the CPU 62 is configured to perform various kinds of operations for performing the above-stated process of setting the correction values which are input to the heaters 3 of the individual channels of the heating plate 23. The input unit 64 is implemented by a mouse, a keyboard, a touch panel or the like, and is configured to allow the user of the apparatus to perform various manipulations in order to perform the flow of the adjustment process of the heating plate 23 is performed.

Each of the temperature transition profile acquiring unit 65 and the correction value creating unit 66 may be implemented by, for example, a computer program, and includes processing step groups through which the correction values corresponding to the heating target regions as stated above can be set. This program may be installed to the controller 6 from a recording medium such as a hard disk, a compact disk, a magneto-optical disk, a memory card, a flexible disk, or the like.

Now, an operation of the heating apparatus according to the first exemplary embodiment will be discussed. First, before a processing of the wafer W is begun, a temperature as a target value corresponding to the kind of the wafer W as a processing target object is output from the controller 6, and temperatures of the heaters 3 are adjusted to the target temperature. Then, as stated earlier, the wafer W having been exposed to light in the exposure apparatus D4 is carried into the heating module 2. The wafer W is placed on the cooling plate 25 by the external transfer mechanism 16, and, after the temperature thereof is adjusted to, e.g., 23° C., the wafer W is delivered onto the elevating pins by the cooperation of the non-illustrated elevating pins and the cooling plate 25. Thereafter, if the wafer W is placed on the supporting pins 24 as the elevating pins are lowered, the controller 6 starts to read the time series data of the correction values to be input to the heating target regions corresponding to the individual heaters 3 from the memory 63 at the time point when the wafer W is placed on the supporting pins 24.

The wafer W is heated by the heaters 3 corresponding to the respective heating target regions. As already stated above, an output pattern of each heater 3 is decided by the target value and the correction value of the corresponding heating target region. Therefore, the time point at which the heating target region reaches the reference temperature on the corresponding temperature transition profile is coincident with the time point at which the wafer W reaches the reference temperature on the target temperature transition profile. Therefore, the temperature transition profile of each heating target region coincides with (becomes very close to) the target temperature transition profile. Thus, the total heat amounts of the respective heating target regions of the wafer W in the temperature rising time period are same, so that the line width of the pattern formed on the wafer W also becomes uniform.

In the above-described exemplary embodiment, the time periods required for the wafer W to reach the reference temperature are made to be uniform between the heating modules 2 and between the heating target regions in the temperature rising time period after the wafer W is placed on the heating plate 23, and the temperature rise curves of the individual temperature transition profiles in the temperature rise transition time period are also made to be same. Therefore, the temperature transition profiles of the respective heating target regions are all same, and the total heat amount in the temperature rise transition time period is uniform within the surface of the wafer W and between the heating modules 2, so that the line width of the pattern formed on the wafer W becomes uniform. Thus, it is possible to perform the heating treatment with high uniformity within the surface of the wafer W and between the wafers W processed in the different heating modules 2.

Furthermore, the heating apparatus according to the exemplary embodiment is not limited to the aforementioned PEB and may be another type of heating apparatus such as a pre-exposure bake module.

Here, if the reference temperature is excessively low, a time for adding the correction value is shortened, so that the degree of uniformity of the temperature transition profiles after reaching the reference temperature may be lowered. Further, if the reference temperature is too close to the target temperature, a temperature variation per unit time is reduced, and an error in reaching times is increased when calculating the times needed to reach the reference temperature. Thus, even if the times needed to reach the reference temperature are made same, it may be still difficult for the temperature rise curves to become coincident. In view of this, it may be desirable to set the reference temperature to be in the range of $\{T2+(T1-T2)\times0.6\} \sim \{T2+(T1-T2)\times0.99\}$. Here, as mentioned above, the target value is denoted by T1 (° C.) and the temperature of the wafer W immediately before the wafer W is placed on the heating plate 23 is denoted by T2 (° C.).

Further, the correction values may be set such that the total heat amounts in the temperature rising time period of the wafer W are same instead of being set such that the times needed to reach the reference temperature are same.

Second Exemplary Embodiment

Figure 10:
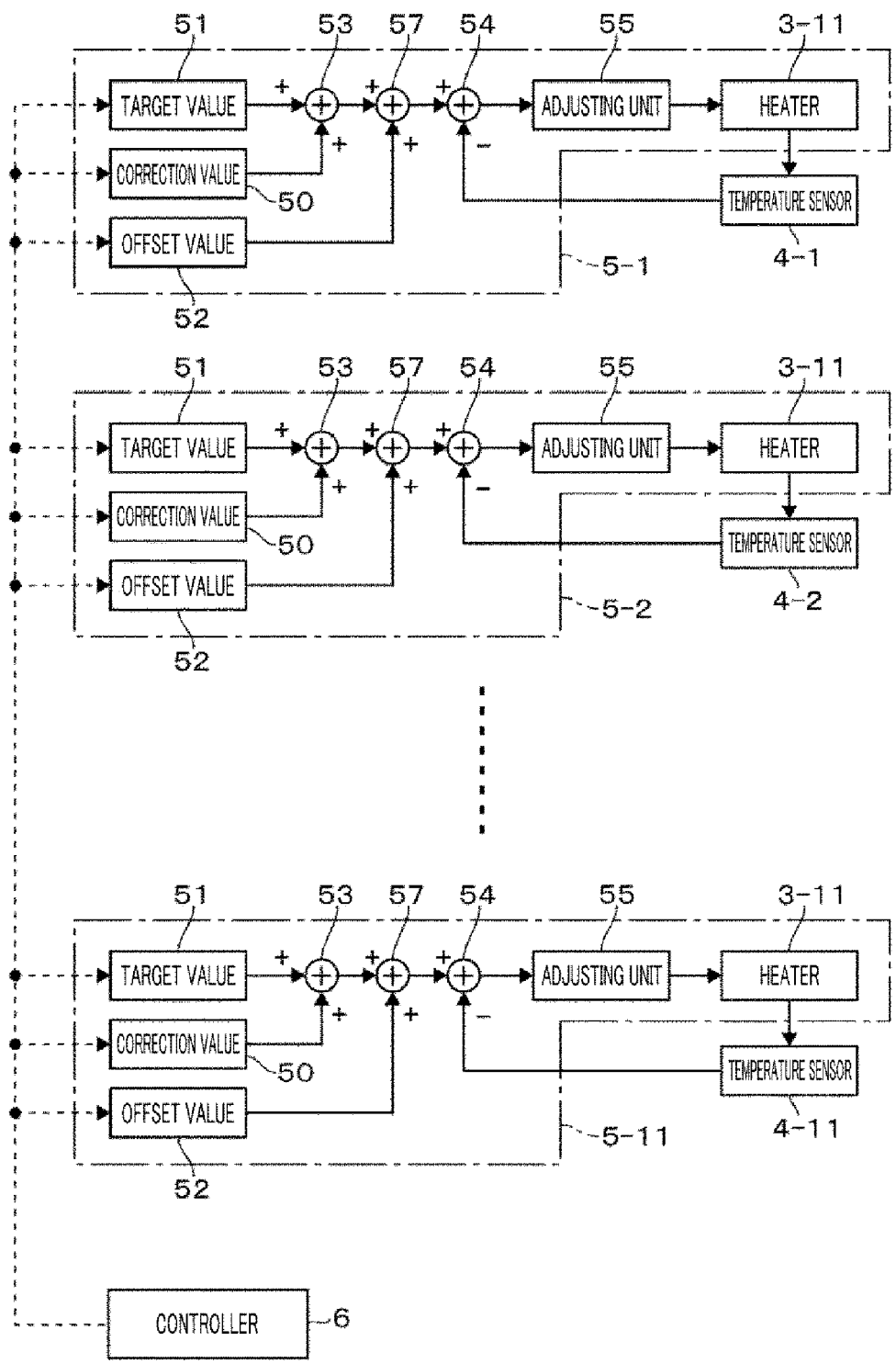
FIG. 10 is a block diagram of a control system constituting a temperature adjusting device provided in a heating module according to a second exemplary embodiment.

For the heating apparatus described in the first exemplary embodiment, it may be also possible to set the total heat amount of each heating target region in the heating treatment to be uniform within the single heating module 2. Further, this method may also be applied in such a way that the total heat amount is set to be uniform between the multiple heating modules 2, and the substrate processing apparatus may be configured to have these uniformed heating modules. The multiple heating modules 2 provided in the substrate processing apparatus according to the second exemplary embodiment will be explained. FIG. 10 illustrates a control system of the temperature adjusting device 56 applied to the heating module 2. Like the temperature adjusting device 56 applied to the heating module 2 in the first exemplary embodiment shown in FIG. 5, the control system of this temperature adjusting device 56 controls the first adding unit 53 to add the target value and the correction value in the corresponding one of the temperature control units 5-1 to 5-11. Then, the output value output from the first adding unit 53 and an offset value output from the controller 6 are added in an offset adding unit 57, and the added value corresponding to a set temperature is output to the second adding unit 54. In FIG. 5, though the first adding unit 53 and the offset adding unit 57 are provided individually, the target value, the correction value and the offset value may be added in a single adding unit.

The offset value sent to the temperature control unit 5 from the controller 6 is set individually for each channel. Though this offset value may be regarded as a correction value, the different term is used to be distinguished from the above-stated correction value. Further, though will be elaborated later, the offset values are set for every section (time interval) Δt in a time period during which the heating treatment is performed on the wafer W. That is, the offset value sent to the temperature control unit 5 of each channel during the heating treatment of the wafer W changes with a lapse of time.

Figure 11:
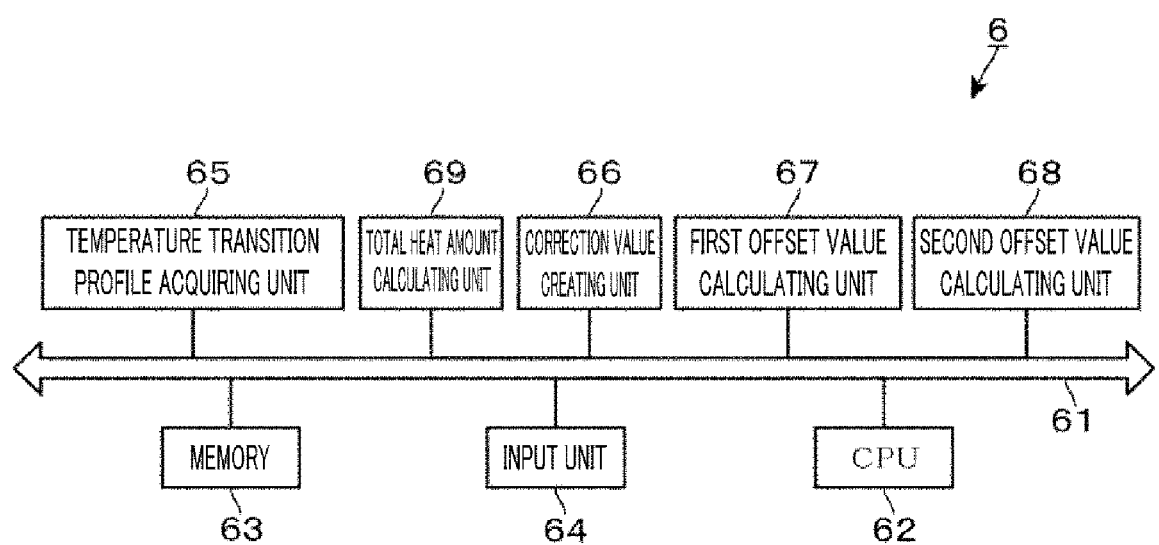
FIG. 11 is a block diagram of a controller provided in the heating module according to the second exemplary embodiment.

Further, as shown in FIG. 11, the controller 6 includes a total heat amount calculating unit 69, a first offset value calculating unit 67 and a second offset value calculating unit 68 in addition to the CPU 62, the memory (storage unit) 63, the input unit 64, the temperature transition profile acquiring unit 65 and the correction value creating unit 66. All of these components of the controller 6 are connected to the bus 61.

The CPU 62 is configured to perform various kinds of operations for performing a flow of an adjustment process of the heating plate 23 to be described hereinafter in addition to the various kinds of operations for performing the flow of the adjustment process of the heating plate 23 as already described in the first exemplary embodiment. Further, the memory 63 stores therein the offset values set for the individual heaters 3 and for the individual time sections which are to be sent to the temperature control units 5. Like the temperature transition profile acquiring unit 65 and the correction value creating unit 66, each of the total heat amount calculating unit 69, the first offset value calculating unit 67 and the second offset value calculating unit 68 is implemented by, for example, a computer program, which includes processing step groups prepared to allow the flow to be described below to be performed.

Figure 12:
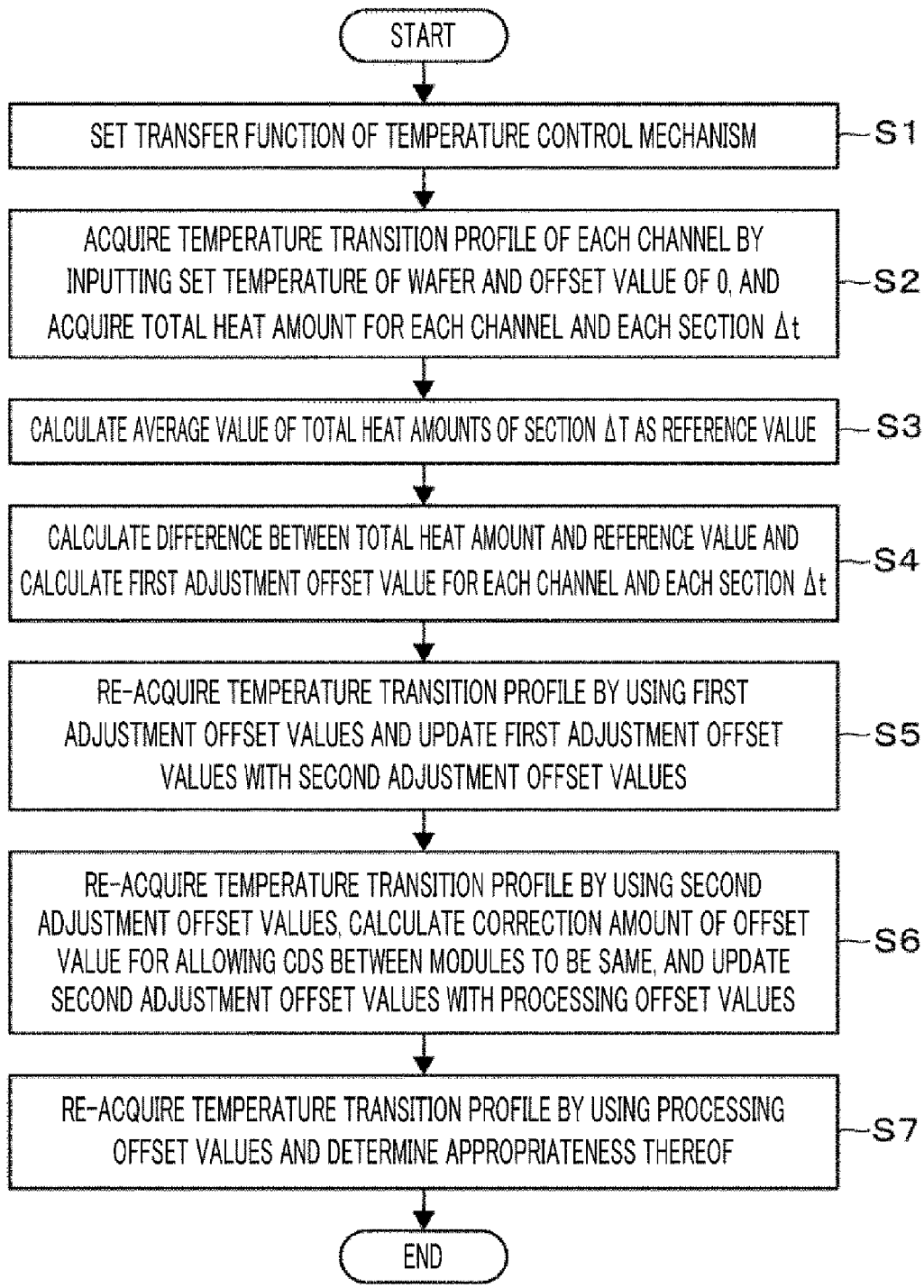
FIG. 12 is a flowchart for describing a process of setting an offset value of a temperature of the heating plate.

Now, referring to a flowchart of FIG. 12, the adjustment process of the heating plate of the single heating module 2 will be explained. The user of the apparatus places the adjustment wafer W1 on the heating plate 23, as described in FIG. 6, and inputs processing steps to the heaters 3 of 1ch to 11ch and acquires the temperature transition profiles of 1ch to 11ch based on outputs from the respective temperature sensors of the adjustment wafer W1. The user calculates an appropriate parameter such as a time constant or a gain forming the transfer function stored in the adjusting unit 55 of the temperature control unit 5 such that, from the acquired temperature transition profiles, the temperatures are same between the channels when the time period during which the heating treatment of the wafer W is performed is observed with a preset time interval, and then sets the transfer function by using the calculated parameter (process S1). For example, in the time period during which the heating treatment is performed, the transfer function is set such that a time point when the wafer W reaches a preset temperature (e.g., 45° C.) during a temperature rise thereof and temperatures of the wafer W at each preset time point after the above time point are identical between the channels.

Figure 13:
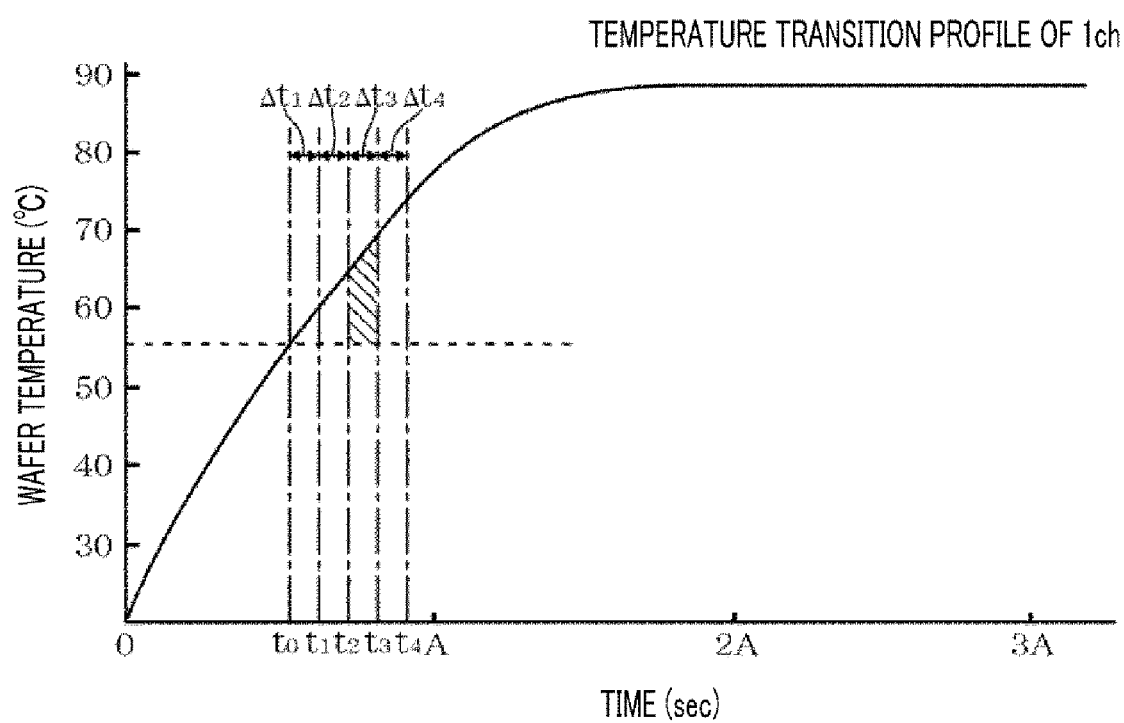
FIG. 13 is a characteristic graph showing a temperature transition profile acquired by a temperature sensor in the process of setting the offset value of the temperature of the heating plate.

Thereafter, a processing temperature of the wafer W when performing the heating treatment on the wafer W is input, as the target value, to the temperature control unit 5 of each channel from the controller 6 with the offset value set to be zero (0). After the temperature of each heater 3 is increased and a heat generation amount of the corresponding heater 3 is stabilized, the adjustment wafer W1 is placed and heated on the heating plate 23, and the temperature transition profiles of 1ch to 11ch are acquired like the same manner as in the case of performing the heating treatment on the wafer W. FIG. 13 presents a graph showing the temperature transition profile of 1ch, as an example. A horizontal axis of the graph indicates an elapsed time after the adjustment wafer W1 is placed and begun to be heated on the heating plate 23, and a vertical axis of the graph indicates a temperature detected by the temperature sensor of the adjustment wafer W1.

For the temperature transition profiles of 1ch to 11ch, a time point, at which the temperature of the wafer W reaches a preset temperature, e.g., 55° C. while the temperature rises toward the processing temperature after a preset time has elapsed from the start of the heating of the adjustment wafer W1, is set as $t_0$, and time points $t_1, t_2, t_3 \ldots t_n$ (n denotes integer) are set from this time point $t_0$ (first time point) at an interval (unit) of section Δt. The individual time points $t_0$ to $t_n$ are set to be identical between the temperature transition profiles of 1ch to 11ch. The time point $t_n$ as a second time point is a time point after the wafer W has reached the processing temperature on the corresponding temperature transition profile, and, for example, may be a time point at which the wafer W is lifted up from the heating plate 23 by the elevating pins in order to reduce the temperature of the wafer W and thus the heating treatment of the wafer W is ended. This time point at which the wafer W is lifted up from the heating plate 23 is a time point at which the wafer W is carried out of the heating plate 23. For the aforementioned section $\Delta t$, a section between the time point $t_0$ and the time point $t_1$ is referred to as a section $\Delta t_1$; a section between the time point $t_1$ and the time point $t_2$, a section $\Delta t_2$; a section between the time point $t_2$ and the time point $t_3$, a section $\Delta t_3$; a section between the time point $t_3$ and the time point $t_4$, a section $\Delta t_4$; ... ; and a section between the time point $t_{n-1}$ and the time point $t_n$, a section $\Delta t_n$. For each of the temperature transition profiles of 1ch to 11ch, the total heat amount is calculated for each section $\Delta t$ (process S2).

Now, a specific method of calculating the total heat amount for a section $\Delta t_d$ (d is an arbitrary number) in a single channel will be described. On the graph of the temperature transition profile as shown in FIG. 13, for example, this total heat amount is acquired as an area of a region surrounded by a line segment indicating a temperature at the time point $t_0$ within the section $\Delta t_d$ and a graph line of the temperature transition profile. In FIG. 13, as an example, a region corresponding to the total heat amount of the section $\Delta t_3$ is dashed.

Then, an average value of the total heat amounts of 1ch to 11ch in each section $\Delta t$ is calculated, and this average value is set as a reference value of the total heat amount in the section $\Delta t$ for which the corresponding average value is calculated (process S3). That is, in this process S3, the average value of the total heat amounts of 1ch to 11ch in the section $\Delta t_1$, the average value of the total heat amounts of 1ch to 11ch in the section $\Delta t_2$, ..., the average value of the total heat amounts of 1ch to 11ch in the section $\Delta t$, are respectively calculated.

Then, a difference between the total heat amount in the section $\Delta t$ and the reference value of the total heat amount in the corresponding section $\Delta t$ is calculated for each channel, and a value corresponding to this calculated value is obtained as the offset value of the corresponding section $\Delta t$ for each channel. To elaborate, in the section $\Delta t_1$, for example, if the total heat amount of 1ch is X1, the total heat amount of 2ch is X2 and the reference value of the section $\Delta t_1$ is Y, X1−Y and X2−Y are calculated. Then, the value corresponding to X1−Y becomes the offset value output to the temperature control unit 5 of 1ch in the section $\Delta t_1$, and the value corresponding to X2−Y becomes the offset value output to the temperature control unit 5 of 2ch in the section $\Delta t_1$. Offset values are set in this way for each section $\Delta t$ and for each channel, and a table in which each channel number, each section $\Delta t$ number and the offset value are correlated is created and stored in the memory 63 of the controller 6 (process S4).

The offset values obtained in this process S4 are offset values for making approximately same the total heat amounts of the respective regions heated by the heaters 3 of 1ch to 11ch in each section $\Delta t$ when performing the heating treatment on the wafer W. These offset values will be referred to as first adjustment offset values to be distinguished from offset values obtained in the subsequent process. The following process is a process for calculating, with the first adjustment offset values, offset values for uniforming the total heat amounts between the channels for each section $\Delta t$ with higher accuracy.

After the first adjustment offset values are acquired, as in the aforementioned process S2, the adjustment wafer W1 is placed and heated on the heating plate 23 in which the heat generation amounts of the heaters 3 are stabilized, and the temperature transition profiles of 1ch to 11ch are acquired, and the total heat amount is calculated for each section $\Delta t$ and for each channel. Here, when heating this adjustment wafer W1, the first adjustment offset values obtained in the process S4 are used. That is, the first adjustment offset value set for each section $\Delta t$ and for each channel is read out from the memory 63 of the controller 6 and sent to the temperature control unit 5 of the corresponding channel. Thus, the heating of the adjustment wafer W1 is performed while the outputs of the heaters 3 are controlled for each channel and for each section $\Delta t$.

Figures 14, 15:
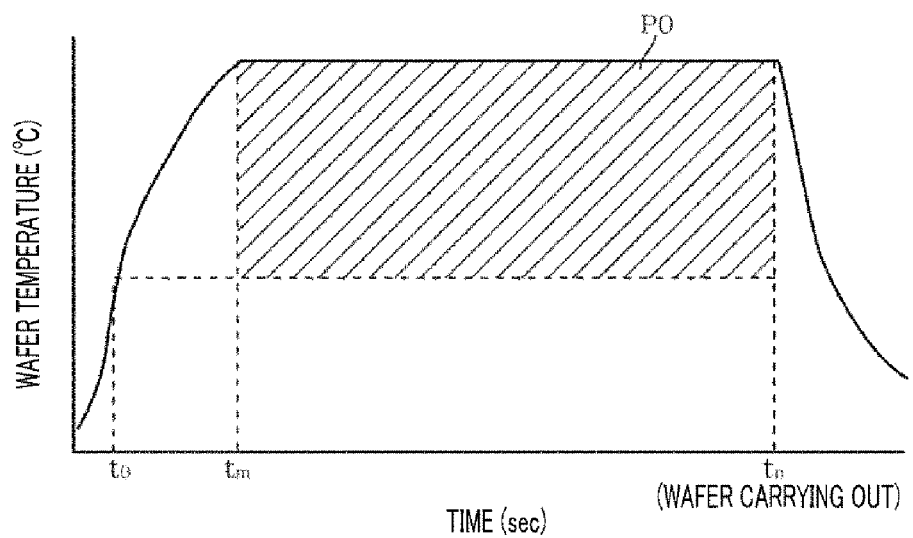
FIG. 14 is a schematic diagram showing a table in which second adjustment offset value groups of the temperature of the heating plate are stored.
FIG. 15 is a characteristic graph showing a temperature transition profile obtained by the temperature sensor in the process of setting the offset value of the temperature of the heating plate.

Then, from the acquired total heat amounts, the average value of the total heat amounts of 1ch to 11ch for each section $\Delta t$ is calculated as the reference value, as in the process S3. Then, as in the process S4, the difference between the total heat amount in the section $\Delta t$ and the reference value of the total heat amount in the corresponding section $\Delta t$ is calculated for each channel, and the value corresponding to this calculated value is obtained as the offset value (for the convenience, referred to as second adjustment offset value) of the corresponding section $\Delta t$ for each channel. Then, as shown in FIG. 14, for example, a table in which each channel number, each section $\Delta t$ number and the second adjustment offset values are correlated is created and stored in the memory 63 of the controller 6 (process S5). That is, the first adjustment offset values acquired in the process S4 are updated with the second adjustment offset values obtained in the process S5.

As stated above, the second adjustment offset values are offset values for making same with high accuracy the total heat amounts of the respective regions of the wafer W heated by the corresponding heaters 3 of 1ch to 11ch in each section $\Delta t$. Accordingly, by performing the heating treatment on the wafer W by using the second adjustment offset values, the wafer W can be heated with high uniformity. In other words, the heating treatment can be performed such that the CD uniformity of the resist pattern is improved within the surface of the wafer W. As mentioned above, however, there are provided the multiple heating modules 2 in the unit block E3, and there may be a difference in characteristics between the modules. The following process is performed to cancel this difference in characteristics and to allow the heating treatment to be performed on wafers W with high uniformity between the heating modules 2. That is, the following process is performed to uniform the CD between the wafers W processed by the respective heating modules.

After the corresponding second adjustment offset values are acquired, as in the above-stated process S2, the adjustment wafer W1 is heated, and the temperature transition profiles of 1ch to 11ch are obtained. Here, when heating the adjustment wafer W1, the second adjustment offset values acquired in the process S5 are used. Then, for each of the temperature transition profiles of 1ch to 11ch, the total heat amount in a time period from a preset time point $t_m$ (0<m<n) to the time point $t_n$ is acquired. As an example, FIG. 15 shows the temperature transition profile of 1ch. On this profile, a region an area of which is acquired as the total heat amount is dashed and indicated as $P_0$. For example, the time point $t_m$ is set to be near a time point at which the temperature rise of the adjustment wafer W1 is ended and the temperature thereof is stabilized.

Figures 16, 17:
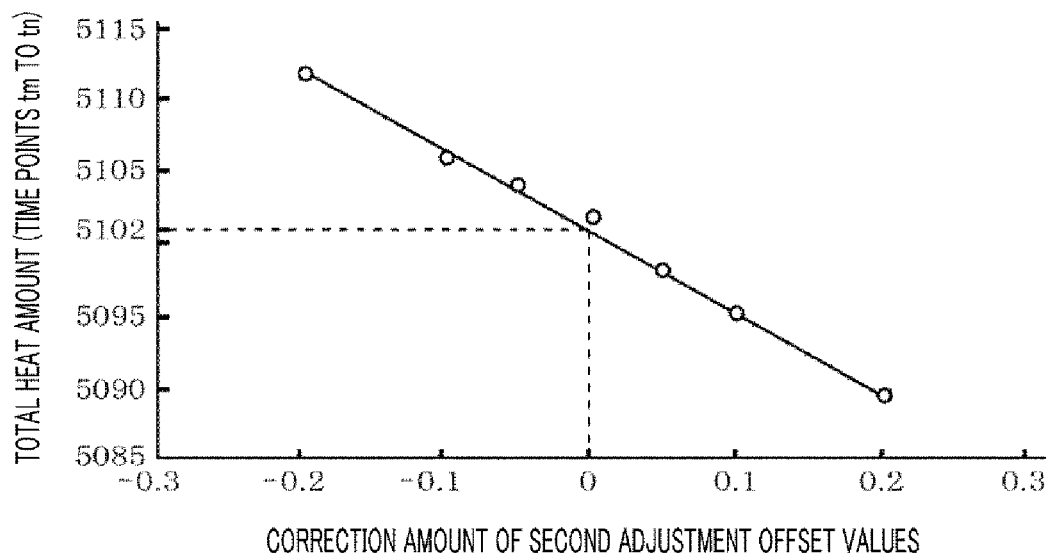
FIG. 16 is a characteristic graph showing data for calculating processing offset values from the second adjustment offset values.
FIG. 17 is a schematic diagram showing a table storing therein the processing offset values as a parameter for adjusting the temperature of the heating plate.

As stated above, if the total heat amount in the time period from the time point $t_m$ to the time point $t_n$ is acquired for each of the channels, a correction amount of the offset value for each channel is determined based on a graph shown in FIG. 16. A vertical axis of this graph represents the total heat amount in the time period from the time point $t_m$ to the time point $t_n$, and a horizontal axis represents the correction amount of the offset value. In this graph, the correction amount at a time when the total heat amount in the time period from the time point $t_m$ to the time point $t_n$ is a reference total heat amount 5102 is set to be zero, and the correction amount of the offset value is determined based on a deviation between the acquired total heat amount and the reference total heat amount. That is, the correction amount of the offset value is decided based on a difference between the reference total heat amount and the acquired total heat amount. Further, since it is found out that there is a correlation between the total heat amount in the time period from the time point $t_m$ to the time point $t_n$ and the CD of the pattern through an evaluation test to be described later, it may be possible, by performing an experiment previously, to acquire a correlation between the total heat amount in the time period from the time point $t_m$ to the time point $t_n$ and the correction amount of the offset value in the same manner as this graph.

If the correction amounts of the offset values are obtained for the respective channels as described above, these correction amounts are added to the corresponding second adjustment offset values of, for example, $\Delta t_1$ to $\Delta t_n$. That is, the correction amount acquired for the single channel is added to the second adjustment offset values of $\Delta t_1$ to $\Delta t_n$ of the corresponding channel. That is, the second adjustment offset values stored in the table of FIG. 14 are updated as illustrated in FIG. 17. The second adjustment offset values corrected by adding the correction amounts thereto are set as processing offset values (process S6).

Thereafter, as in the process S5, the adjustment wafer W1 is heated, and the temperature transition profiles of 1ch to 11ch are acquired. When heating the adjustment wafer W1 this time, the processing offset values obtained in the process S6 are used. Then, for each channel, the total heat amount in the time period from the time point $t_m$ to the time point $t_n$ is obtained from the corresponding temperature transition profile, and it is determined whether this total heat amount is included in a tolerance range (process S7). If the total heat amount is found to be within the tolerance range, the set processing offset value is regarded as being appropriate, and the adjustment process of the heating plate is ended. If the total heat amount is found to be inappropriate, on the other hand, the set processing offset value is regarded as being inappropriate, and the adjustment process is performed again from, for example, the above-stated certain process.

Further, in the above-described process, the creation of the temperature transition profiles based on the temperature detection signals from the adjustment wafer W1 is performed by the temperature transition profile acquiring unit. The calculation of the total heat amount of each section $\Delta t$ and the calculation of the total heat amount in the time period from the time point $t_m$ to the time point $t_n$ based on the corresponding temperature transition profile are performed by the total heat amount calculating unit 69. Further, the calculation of the average value of the total heat amounts of each section $\Delta t$ and the calculation of the deviation of the total heat amount of each channel from the corresponding average value of each section $\Delta t$ are performed by the first offset value calculating unit 67. Furthermore, the calculation of the processing offset values from the graph of FIG. 16 is performed by the second offset value calculating unit 68.

Though the adjustment process of the heating plate 23 of the single heating module 2 has been described so far, the same adjustment process may be performed for the heating plates 23 of other heating modules 2. That is, the processing offset values are set for every heating module 2. In order to uniform the total heat amount between the modules, the correlation (the graph of FIG. 16) between the total heat amount in the time period from the time point $t_m$ to the time point $t_n$ and the correction amount of the offset value used in the above-stated process S6 is commonly used in the adjustment process of the heating plates of the respective modules. That is, as the reference total heat amount (5102 in FIG. 16) for calculating the correction amount, a common value is used in the adjustment processes of the heating plates of the respective modules.

In addition, it may be desirable that the adjustment wafers W1 used in the processes S1 to S7 and in the respective heating modules 2 may have the same temperature characteristic for the purpose of uniforming the total heat amount within the surface of the wafer W and between the wafers W. Accordingly, it may be desirable to use a common adjustment wafer W1 in the processes S1 to S7, for example, and to use common adjustment wafers W1 in the adjustment processes of the heating plates of the modules. On the adjustment wafer W1, the areas of the respective regions heated by the corresponding heaters 3 of 1ch to 11ch are set to be same, and these regions are made of the same material. Therefore, in the above-described adjustment process of the heating plate, a digital value of the temperature detection signal from the adjustment wafer W1 is treated as the total heat amount.

The heating treatment of the wafer W by the heating modules 2 adjusted as described above is performed in the same manner as the adjustment wafer W1 is heated in the process S7 of the above-described adjustment process except that the wafer W instead of the adjustment wafer W1 is heated. That is, the processing offset values set for each section $\Delta t$ and for each channel are read out from the table of the memory 63 of the controller 6 and sent to the temperature control units 5, and the wafer W is heated while controlling the outputs of the heaters 3 for each channel and for each section $\Delta t$.

Figure 18:
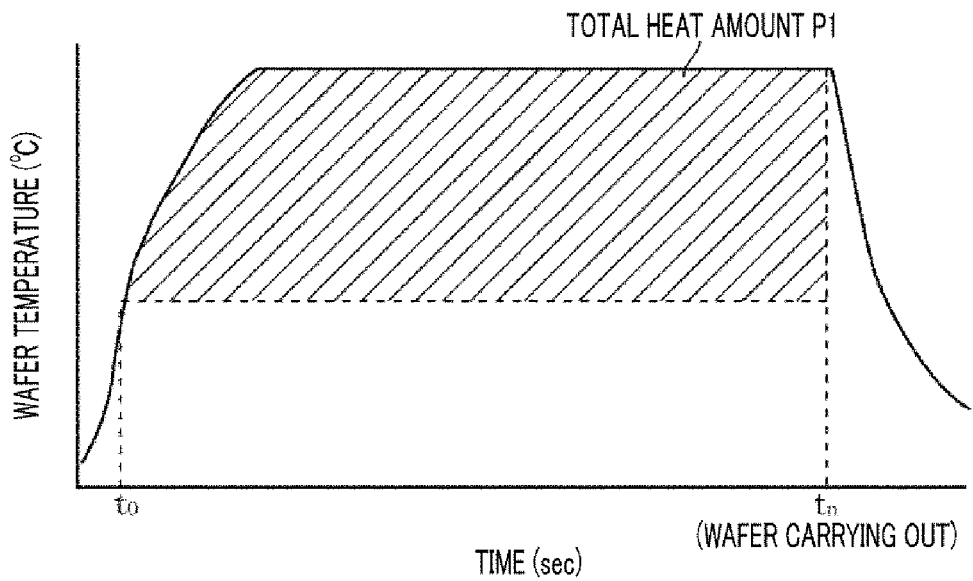
FIG. 18 is a characteristic graph showing a temperature transition profile acquired by using the processing offset values.

FIG. 18 presents a temperature transition profile of a single channel acquired from the adjustment wafer W1 which is heated by one of the heating modules 2 and on which the adjustment process of the processes S1 to S7 is performed. As stated above, since the adjustment wafer W1 has the substantially same structure as the wafer W, this temperature transition profile may be regarded as the temperature transition profile of the wafer W. Further, since the total heat amount of each section $\Delta t$ is set to be uniform between the respective channels, temperature transition profiles of the other ten channels may be the same as that shown in FIG. 18. In the drawing, a region corresponding to the total heat amount in a time period from the time point $t_0$ to the time point $t_n$ is marked as P1. For the convenience of explanation, this region P1 is defined as a total heat amount P1.

Figure 19:
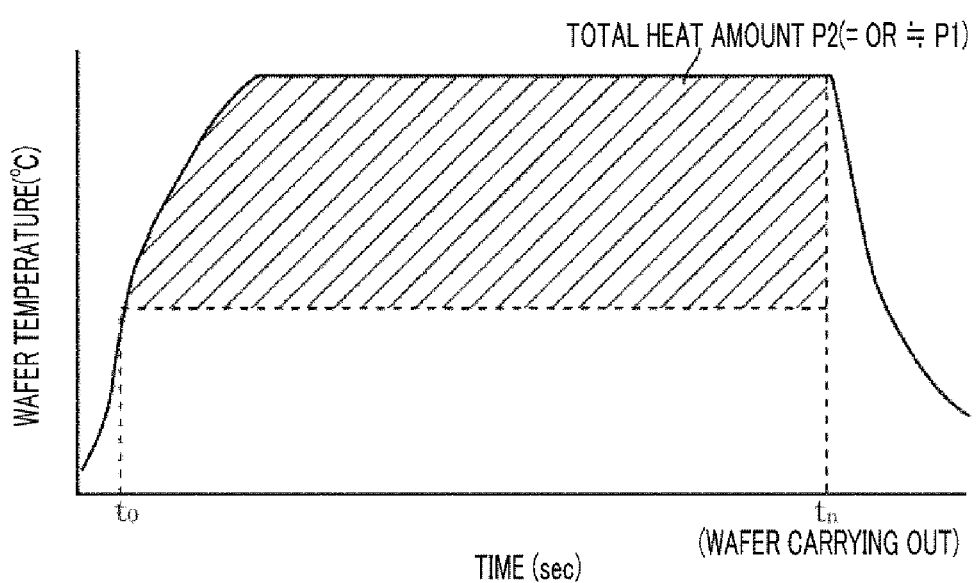
FIG. 19 is a characteristic graph showing a temperature transition profile acquired by using the processing offset values.

FIG. 19 shows a temperature transition profile of a single channel acquired from the adjustment wafer W1, which is heated in another heating module 2 and on which the adjustment process of the processes S1 to S7 is performed. In the drawing, a region corresponding to a total heat amount in a time period from the time point $t_0$ to the time point $t_n$ is marked as P2. For the convenience of explanation, this region P2 is defined as a total heat amount P2. As stated above, the offset values are set in the respective heating modules 2 such that the total heat amounts P1 and P2 are same. To be more specific, if the average value of the total heat amounts P1 and P2 is set as the reference total heat amount, it is desirable that the total heat amounts P1 and P2 are included in a range of ±0.5% of the reference total heat amount, and, more desirably, within a range of ±0.2%. Alternatively, the reference total heat amount may be a value previously set irrelevant to the total heat amounts P1 and P2.

In the above-described coating and developing apparatus 1, for the multiple heating modules 2 configured to perform the PEB, the total heat amounts of the heating target regions of the wafer W respectively corresponding to the multiple heaters 3 during the heating treatment of the wafer W are set to be same within the single heating module 2 or between the multiple heating modules 2. Accordingly, it is possible to perform the heating treatment with high uniformity within the surface of the single wafer W or between the wafers W.

The unit block E2 of the above-described coating and developing apparatus 1 has the same configuration as the unit block E3 except that a resist coating module is provided instead of the developing module 14. The wafer W coated with a resist in the resist coating module is transferred into and heat-treated by one of multiple heating modules provided in the unit block E2 and the coated resist is dried, so that a resist film is formed. By performing the above-described adjustment process of the heating plate on these multiple heating modules of the unit block E2 as well, it is possible to form the resist film with high uniformity within the surface of the wafer W and between the wafers W, so that the CD uniformity can be improved within the surface of the wafer W and between the wafers W.

Accordingly, by making same the total heat amounts by using the offset values in addition to making same the temperature rise curves of the temperature transition profiles of the respective heating target regions by using the correction values as described in the first exemplary embodiment, the accumulated temperature can be uniform within the surface of the wafer W with higher accuracy, so that the heating treatment having high uniformity can be performed.

Further, the unit block E1 has the same configuration as the unit block E2 except that a chemical liquid coating module configured to form the antireflection film is provided instead of the resist coating module. The adjustment process of the heating plate may also be performed on multiple heating modules of this unit block E1.

In the above-described adjustment process, the offset values are newly acquired in the processes after the process S2. By way of example, it is assumed that the aforementioned process S1 is performed, and the offset values are already set by a method different from the processes after the process S2 such that the temperatures at the respective time points, which are set by the preset time unit, after a time point at which the temperature of the wafer W reaches, e.g., 55° C. while the temperature of the wafer W rises are identical between the channels. In such a case, in the processes after the process S2, an increment or a decrement of the already set offset values may be calculated. Further, in the processes S3 and S5, the average value of the total heat amounts of each channel is calculated for each section Δt and is set as the reference value. However, a preset value may be used as the reference value.

Further, in the heating module 2, the single temperature sensor 4 is provided for the heater 3 of the single channel to control the heat generation amount of the corresponding heater 3. However, multiple temperature sensors 4 may be provided for the heater 3 of the single channel, and the control of the heat generation amount of the corresponding heater 3 may be performed based on, for example, an average value of outputs of the multiple temperature sensors 4.

In order to allow the total heat amounts to be uniform within the surface of the wafer W with higher accuracy, the process S5 may be repeated multiple times. To elaborate, by using the offset values acquired in the process S5 which is performed for the first time, the process S5 is performed for the second time and then offset values are newly acquired. In case of performing the process S5 for the third time, the offset values obtained in the process S5 performed for the second time are used. In this way, by using the offset values obtained in the process S5 which is performed immediately before, the next process S5 is performed.

In the above-stated process S6, the total heat amount in a period from a preset time point after the adjustment wafer W1 is placed on the heating plate 23, for example, the time point at which the temperature of the wafer W reaches the processing temperature to the time point at which the adjustment wafer W1 is carried out of the heating plate 23 is calculated for each of the heating target regions. Here, the expression "to the time point at which the adjustment wafer W1 is carried out of the heating plate 23" is not only limited to the time point at which the adjustment wafer W1 is carried out of the heating plate 23 but also includes a time point slightly before this time point as long as the total heat amount can be uniformed. Further, when it is said that the total heat amount is uniform, it means the total heat amounts of the respective heating target regions in the multiple heating modules fall within the range of ±0.5% of the reference total heat amount.

Furthermore, the determination of the appropriateness of the processing offset values in the process S7 may not be limited to being performed by using the temperature transition profiles. By way of example, the wafer W having an exposed resist film formed thereon may be heated, a pattern is formed by developing this wafer W, and a CD of this pattern is measured. By determining whether or not this CD is appropriate, the appropriateness of the processing offset values can be determined.

[Evaluation Tests]

Now, evaluation tests conducted regarding the present disclosure will be explained.

<Evaluation Test 1>

A processing performed by the coating and developing apparatus 1 according to the second exemplary embodiment is performed, and the resist patterns are formed on multiple wafers W, respectively. In this processing, the processing is performed on the wafers W in the heating modules 2 such that the wafers W have different total heat amounts in the aforementioned time period from the time point $t_m$ to the time point $t_n$. The CD of the resist pattern for each wafer W is measured, and an average value thereof is calculated. Then, a correlation of this average value and the corresponding total heat amount is investigated.

Figure 20:
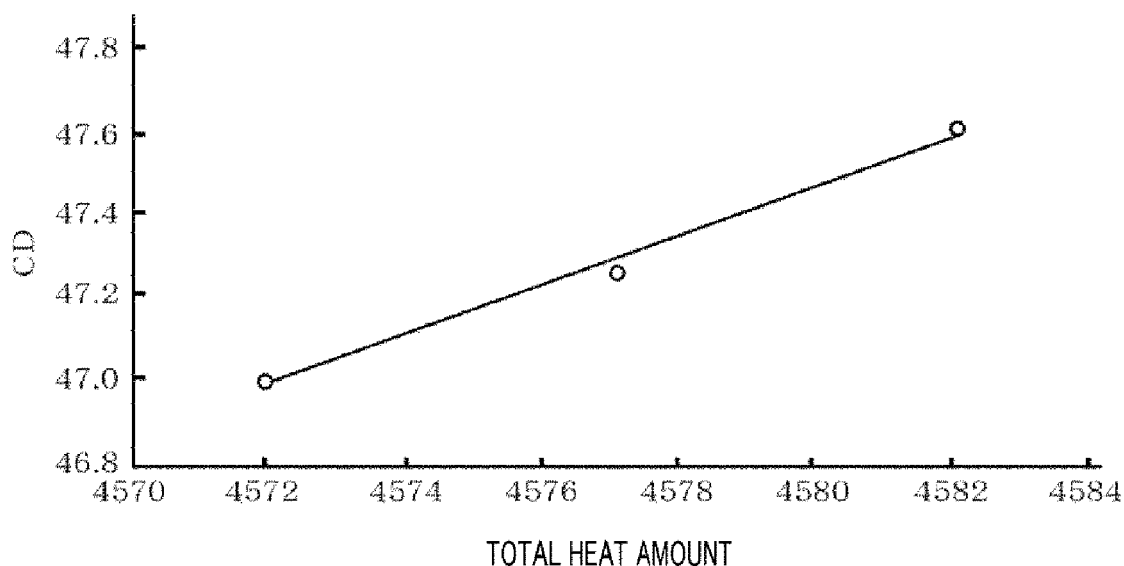
FIG. 20 is a characteristic graph showing a result of an evaluation test.

A plot on a characteristic graph of FIG. 20 shows the result of the evaluation test 1. A vertical axis and a horizontal axis of this characteristic graph indicate the average value of CD and the total heat amount, respectively. An approximate straight line is obtained from the plot, and a coefficient of determination ($R^2$) is calculated to be 0.9894, and it is found out that there is a high correlation between the time period from the time point $t_m$ to the time point $t_n$ and the CD of the resist pattern. Accordingly, as explained in the above-described process S6, by correcting the offset value according to the total heat amount, the CDs can be made uniform between the heating modules 2.

<Evaluation Test 2>

As an evaluation test 2-1, the adjustment process of the heating plate 23 as described in the second exemplary embodiment is performed. Then, the adjustment wafer W1 is heated by the heating plate 23 on which the adjustment process is already performed, and the temperature transition profiles are acquired and total heat amounts of the respective channels in the time period from the time point $t_0$ to the time point $t_n$ are calculated. As an evaluation test 2-2, the process S1 is performed, and offset values are set such that the temperatures at respective time points, which are set on preset time unit, after the temperature of the wafer W is raised to reach a predetermined temperature are identical between the channels. That is, in the evaluation test 2-2, the offset values are set without acquiring the total heat amount for each channel and each section Δt which is set in the same way as in the above-stated adjustment process of the heating plate 23. After the offset values are set, the adjustment wafer W1 is heated by the heating plate 23 which is set in the same way as in the evaluation test 2-1, and the total heat amount of each channel in the time period from the time point $t_0$ to the time point $t_n$ is calculated.

Figure 21:
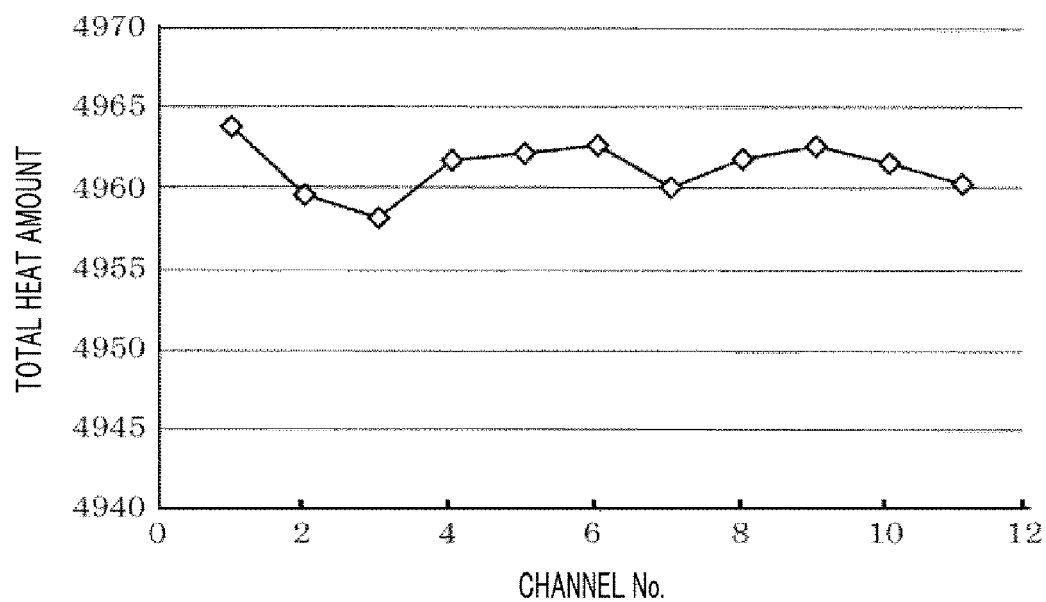
FIG. 21 is a characteristic graph showing a result of an evaluation test.
Figure 22:
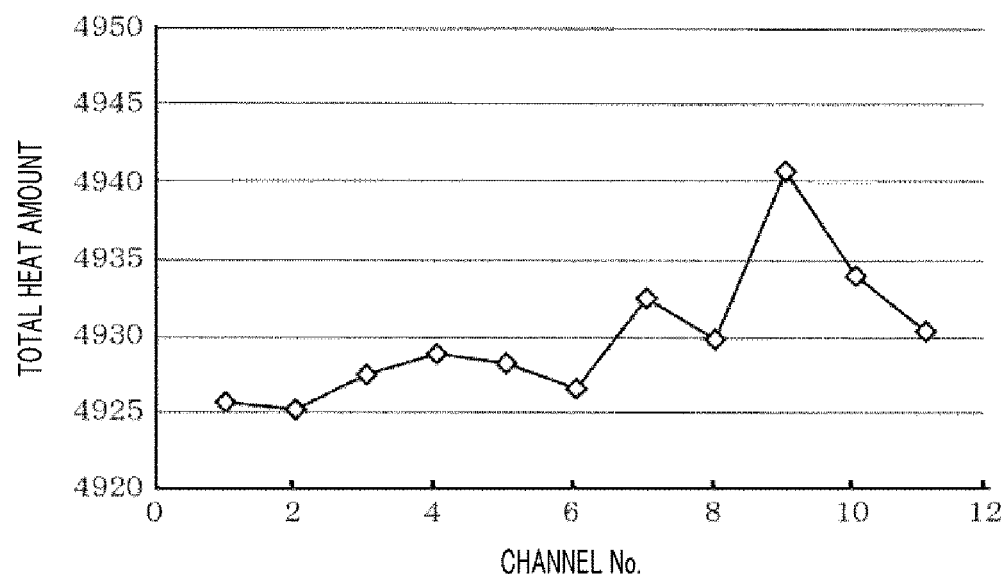
FIG. 22 is a characteristic graph showing a result of the evaluation test.

Characteristic graphs of FIG. 21 and FIG. 22 respectively show the results of the evaluation tests 2-1 and 2-2. A horizontal axis and a vertical axis of each characteristic graph indicate a channel number and the total heat amount, respectively. As compared to the evaluation test 2-2, a deviation between the total heat amounts of the respective channels is suppressed in the evaluation test 2-1. Accordingly, from the result of this evaluation test 2, it is estimated that the deviation of the CDs of the resist pattern within the surface of the wafer W can be suppressed more greatly by performing the adjustment process of the heating plate 23.

<Evaluation Test 3>

As an evaluation test 3-1, in the same way as in the evaluation test 2-1, the adjustment process of the heating plate 23 as described in the second exemplary embodiment is performed, and the offset values are set. Then, the adjustment wafer W1 is heated by the heating plate 23 on which the adjustment process is already performed, and the temperature transition profiles are acquired and a sum of the temperatures detected in the time period from the time point $t_0$ to the time point $t_n$ is calculated from the temperature transition profiles. Further, by using the heating plate 23, the PEB is performed on a wafer W having an exposed resist film, and a resist pattern is formed by developing this resist film. Then, the CD of the pattern is measured at each portion within the surface of the wafer W, and 3σ is calculated.

As an evaluation test 3-2, in the same way as in the evaluation test 2-2, the offset values are set by a method different from the method described in the second exemplary embodiment. Thereafter, as in the evaluation test 3-1, the adjustment wafer W1 is heated by the adjusted heating plate 23, and the temperature transition profiles are acquired and the sum of the temperatures detected in the time period from the time point $t_0$ to the time point $t_n$ is calculated. Further, as in the evaluation test 3-1, the resist pattern is formed by performing the PEB using the heating plate 23. Then, the CD of the pattern is measured at each portion within the surface of the wafer W, and 3σ is calculated.

Figure 23:
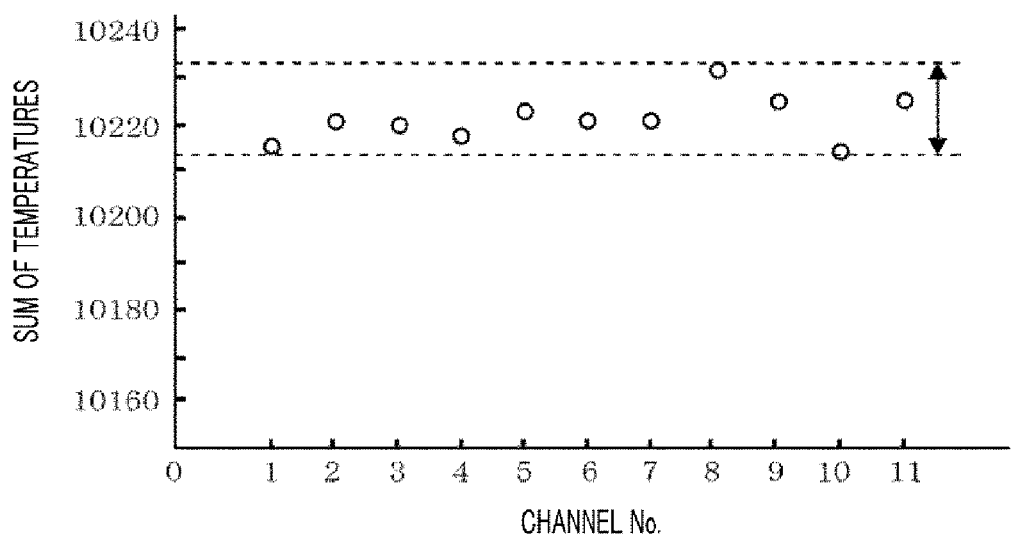
FIG. 23 is a characteristic graph showing a result of an evaluation test.
Figure 24:
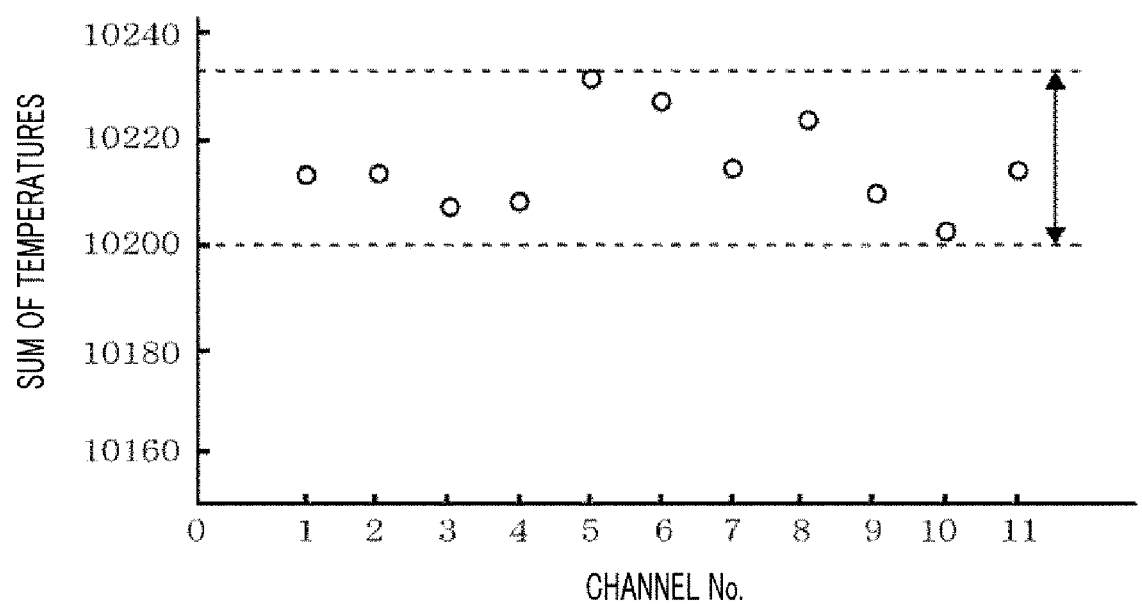
FIG. 24 is a characteristic graph showing a result of the evaluation test.

Characteristic graphs of FIG. 23 and FIG. 24 respectively show results of the evaluation tests 3-1 and 3-2. A horizontal axis of each characteristic graph indicates the channel number, and a vertical axis thereof represents the sum of the temperatures. As can be clearly seen from each characteristic graph, a deviation between the sums of the detected temperatures of the respective channels is found to be smaller in the evaluation test 3-1 than in the evaluation test 3-2. Accordingly, it is deemed that the wafer W can be heated with higher uniformity within the surface thereof in the evaluation test 3-1. Further, 3σ is 0.179 nm in the evaluation test 3-1 and 0.321 nm in the evaluation test 3-2. Thus, the comparison of these 3σ values also indicate that the deviation of the CD is suppressed in the evaluation test 3-1.

<Evaluation Test 4>

As an evaluation test 4-1, the adjustment method according to the second exemplary embodiment is performed as an adjustment method of the heating modules 2 by using the coating and developing apparatus described in the second exemplary embodiment. Further, as an evaluation test 4-2, the correction values are set, and only the processes shown in the flowchart of FIG. 12 are performed.

In each of the evaluation tests 4-1 and 4-2, the total heat amounts of six heating modules 2 in the temperature rise transition time period are measured, and the result is shown in Table 1.

TABLE 1

|  | Total heat amount (° C. · sec) | |
| --- | --- | --- |
|  | Evaluation test 4-1 | Evaluation test 4-2 |
| Heating module No. 1 | 5058 | 5058 |
| Heating module No. 2 | 5059 | 5058 |
| Heating module No. 3 | 5057 | 5057 |
| Heating module No. 4 | 5059 | 5067 |
| Heating module No. 5 | 5057 | 5056 |
| Heating module No. 6 | 5059 | 5059 |
| Maximum − minimum | 2 | 11 |

As shown in Table 1, in the evaluation test 4-2, a difference between the total heat amounts of the heating modules 2 in the temperature rise transition time period is found to be 11° C.·sec. In the evaluation test 4-1, however, the difference between the total heat amounts of the heating modules 2 in the temperature rise transition time period is found to be 2° C.·sec.

As can be seen from this result, it is found out that by controlling the temperature transition profiles of the respective heating target regions to be same by correcting the set temperature of the heaters 3, the difference in the total heat amounts while the temperature of the wafer W rises can be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A heating apparatus configured to mount a substrate on a mounting table and heat the substrate, the heating apparatus comprising:
   multiple heaters which are provided in the mounting table and heat generation amounts of which are controlled independently;

temperature detection units each configured to detect a temperature of heating target region heated by the corresponding heater; and temperature control units respectively provided for the heaters, wherein each of the temperature control units comprises:

an adjusting unit configured to calculate a deviation between the detected temperature of the corresponding temperature detection unit and a set temperature and output a control signal for a supply power to the corresponding heater;

an adding unit configured to obtain the set temperature by adding a target temperature as a processing temperature and a correction value; and a correction value output unit configured to output the correction value, wherein the correction value output unit is configured to output time series data defining the correction value at every elapsed time such that a temperature of the substrate at a predetermined reference time point while the temperature of the substrate rises toward the processing temperature becomes a reference temperature on a temperature transition profile of the substrate which indicates a relationship between the temperature of the substrate and the elapsed time after the substrate is mounted on the mounting table in a state that the heat generation amount of the heater is stabilized, and wherein when the target temperature is denoted by T1 and the temperature of the substrate immediately before the substrate is mounted on the mounting table is denoted by T2, the reference temperature is selected within a range of $\{T2+(T1-T2)\times0.6\}\sim\{T2+(T1-T2)\times0.99\}$.

2. A heating apparatus configured to mount a substrate on a mounting table and heat the substrate, the heating apparatus comprising:

multiple heaters which are provided in the mounting table and heat generation amounts of which are controlled independently;

temperature detection units each configured to detect a temperature of heating target region heated by the corresponding heater; and temperature control units respectively provided for the heaters, wherein each of the temperature control units comprises:

an adjusting unit configured to calculate a deviation between the detected temperature of the corresponding temperature detection unit and a set temperature and output a control signal for a supply power to the corresponding heater;

an adding unit configured to obtain the set temperature by adding a target temperature as a processing temperature and a correction value; and a correction value output unit configured to output the correction value, wherein the correction value output unit is configured to output time series data defining the correction value at every elapsed time such that a temperature of the substrate at a predetermined reference time point while the temperature of the substrate rises toward the processing temperature becomes a reference temperature on a temperature transition profile of the substrate which indicates a relationship between the temperature of the substrate and the elapsed time after the substrate is mounted on the mounting table in a state that the heat generation amount of the heater is stabilized, wherein the heating apparatus further comprises:

a storage unit configured to store therein, for each of the heating target regions of the substrate respectively corresponding to the multiple heaters, an offset value for each of time intervals, which are obtained by dividing a time period from a first preset time point to a second preset time point in plural, wherein the adding unit is configured to add the target temperature, the correction value and the offset value, the first preset time point is a time point while the temperature of the substrate rises toward the processing temperature on the temperature transition profile of the substrate after the substrate is mounted on the mounting table in the state that the heat generation amount of the heater is stabilized, and the second preset time point is a time point after the temperature of the substrate reaches the processing temperature on the temperature transition profile, and the offset value is set such that total heat amounts of the heating target regions of the substrate respectively corresponding to the multiple heaters in the time period from the first preset time point to the second preset time point are identical between the heating target regions.

3. A substrate processing apparatus comprising multiple heating apparatuses as claimed in claim 2, wherein the offset value is set such that the total heat amounts of the heating target regions of the substrate respectively corresponding to the multiple heaters in the time period from the first preset time point to the second preset time point are identical between the multiple heating apparatuses.

4. The substrate processing apparatus of claim 3, wherein the total heat amount of each of the heating target regions is within a range of ±0.5% of a reference total heat amount in each of the multiple heating apparatuses.

* * * * *

UNITED STATES PATENT AND TRADEMARK OFFICE
CERTIFICATE OF CORRECTION

PATENT NO. : 10,886,151 B2
APPLICATION NO. : 15/882111
DATED : January 5, 2021
INVENTOR(S) : Kenichi Shigetomi et al.

It is certified that error appears in the above-identified patent and that said Letters Patent is hereby corrected as shown below:

In the Specification

Column 13, Line 37, "$\Delta t$" should be -- $\Delta t_n$ --

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*